US006992925B2

(12) United States Patent  
Peng

(10) Patent No.: US 6,992,925 B2  
(45) Date of Patent: *Jan. 31, 2006

(54) HIGH DENSITY SEMICONDUCTOR MEMORY CELL AND MEMORY ARRAY USING A SINGLE TRANSISTOR AND HAVING COUNTER-DOPED POLY AND BURIED DIFFUSION WORDLINE

(75) Inventor: Jack Zezhong Peng, San Jose, CA (US)

(73) Assignee: Kilopass Technologies, Inc., Santa Clara, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 10/798,753

(22) Filed: Mar. 10, 2004

(65) Prior Publication Data

US 2004/0223363 A1   Nov. 11, 2004

Related U.S. Application Data

(63) Continuation-in-part of application No. 10/765,802, filed on Jan. 26, 2004, now Pat. No. 6,940,751, which is a continuation-in-part of application No. 10/677,613, filed on Oct. 2, 2003, now Pat. No. 6,898,116, which is a continuation-in-part of application No. 10/448,505, filed on May 30, 2003, now Pat. No. 6,856,540, and a continuation-in-part of application No. 10/133,704, filed on Apr. 26, 2002, now Pat. No. 6,777,757.

(51) Int. Cl.  
  *G11C 11/34* (2006.01)

(52) U.S. Cl. ............. 365/177; 365/185.14; 365/185.18

(58) Field of Classification Search ................ 365/177, 365/178, 185.184, 185.18, 185.29, 185.14  
See application file for complete search history.

(56) References Cited

U.S. PATENT DOCUMENTS

| | | | |
|---|---|---|---|
| 3,634,929 | A | 1/1972 | Yoshida et al. |
| 4,322,822 | A | 3/1982 | McPherson |
| 4,488,262 | A | 12/1984 | Basire et al. |
| 4,490,900 | A | 1/1985 | Chiu |
| 4,502,208 | A | 3/1985 | McPherson |
| 4,507,757 | A | 3/1985 | McElroy |
| 4,543,594 | A | 9/1985 | Mohsen et al. |
| 4,546,273 | A | 10/1985 | Osman |
| 4,599,705 | A | 7/1986 | Holmberg et al. |

(Continued)

FOREIGN PATENT DOCUMENTS

EP    0 295 935 A1    12/1988

(Continued)

OTHER PUBLICATIONS

Miranda, Enrique et al; Analytic Modeling of Leakage Current Through Multiple Breakdown Paths in SiO2 Films; 39th Annual International Reliability Physics Symposium; Orlando, FL 2001.

(Continued)

*Primary Examiner*—Gene N. Auduong  
(74) *Attorney, Agent, or Firm*—Perkins Coie LLP

(57) ABSTRACT

A programmable memory cell comprised of a transistor located at the crosspoint of a column bitline and a row wordline is disclosed. The transistor has its gate formed from the column bitline and its source connected to the row wordline. The memory cell is programmed by applying a voltage potential between the column bitline and the row wordline to produce a programmed p+ region to form a p-n diode in the substrate underlying the gate of the transistor. Further, the wordline is formed from a buried diffusion N+ layer while the column bitline is formed from a counter-doped polysilicon layer.

7 Claims, 28 Drawing Sheets

U.S. PATENT DOCUMENTS

| | | |
|---|---|---|
| 4,613,886 A | 9/1986 | Chwang |
| 4,677,742 A | 7/1987 | Johnson |
| 4,720,818 A * | 1/1988 | Takeguchi ................. 365/201 |
| 4,758,745 A | 7/1988 | El Gamal et al. |
| 4,758,986 A | 7/1988 | Kuo |
| 4,794,562 A | 12/1988 | Kato et al. |
| 4,823,181 A | 4/1989 | Mohsen et al. |
| 4,870,302 A | 9/1989 | Freeman |
| 4,876,220 A | 10/1989 | Mohsen et al. |
| 4,899,205 A | 2/1990 | Hamdy et al. |
| 4,943,538 A | 7/1990 | Mohsen et al. |
| 4,962,342 A | 10/1990 | Mead et al. |
| 5,138,410 A | 8/1992 | Takebuchi |
| 5,150,179 A | 9/1992 | Gill |
| 5,303,185 A | 4/1994 | Hazani |
| 5,304,871 A | 4/1994 | Dharmarajan et al. |
| 5,323,342 A | 6/1994 | Wada et al. |
| 5,412,244 A | 5/1995 | Hamdy et al. |
| 5,455,525 A | 10/1995 | Ho et al. |
| 5,477,499 A | 12/1995 | Van Buskirk et al. |
| 5,496,756 A | 3/1996 | Sharma et al. |
| 5,576,568 A | 11/1996 | Kowshik |
| 5,578,848 A | 11/1996 | Kwong et al. |
| 5,586,270 A | 12/1996 | Rotier et al. |
| 5,587,603 A | 12/1996 | Kowshik |
| 5,600,265 A | 2/1997 | El Gamal et al. |
| 5,650,336 A | 7/1997 | Eriguchi et al. |
| 5,675,541 A | 10/1997 | Leterrier |
| 5,675,547 A | 10/1997 | Koga |
| 5,745,417 A | 4/1998 | Kobayashi et al. |
| 5,781,032 A | 7/1998 | Bertolet et al. |
| 5,784,636 A | 7/1998 | Rupp |
| 5,825,200 A | 10/1998 | Kolze |
| 5,825,201 A | 10/1998 | Kolze |
| 5,880,512 A | 3/1999 | Gordon et al. |
| 5,889,411 A | 3/1999 | Chaudhary |
| 5,892,962 A | 4/1999 | Cloutier |
| 5,909,049 A | 6/1999 | McCollum |
| 5,929,482 A | 7/1999 | Kawakami |
| 5,986,931 A | 11/1999 | Caywood |
| 5,986,939 A | 11/1999 | Yamada |
| 6,016,268 A | 1/2000 | Worley |
| 6,031,761 A | 2/2000 | Ghilardelli et al. |
| 6,034,893 A | 3/2000 | Mehta |
| 6,040,968 A | 3/2000 | Duvvury et al. |
| 6,047,243 A | 4/2000 | Bang |
| 6,064,225 A | 5/2000 | Andrews et al. |
| 6,064,595 A | 5/2000 | Logie et al. |
| 6,077,719 A | 6/2000 | Koike |
| 6,084,428 A | 7/2000 | Kolze et al. |
| 6,097,077 A | 8/2000 | Gordon et al. |
| 6,153,463 A | 11/2000 | Wei et al. |
| 6,157,568 A | 12/2000 | Schmidt |
| 6,166,954 A | 12/2000 | Chern |
| 6,198,652 B1 | 3/2001 | Kawakubo |
| 6,214,666 B1 | 4/2001 | Mehta |
| 6,215,140 B1 | 4/2001 | Reisinger et al. |
| 6,218,274 B1 | 4/2001 | Komatsu |
| 6,232,631 B1 | 5/2001 | Schmidt et al. |
| 6,236,229 B1 | 5/2001 | Or-Bach |
| 6,249,809 B1 | 6/2001 | Bro |
| 6,282,123 B1 | 8/2001 | Mehta |
| 6,294,809 B1 | 9/2001 | Logie |
| 6,297,103 B1 | 10/2001 | Ahn et al. |
| 6,304,666 B1 | 10/2001 | Warren et al. |
| 6,337,250 B2 | 1/2002 | Furuhata |
| 6,351,428 B2 | 2/2002 | Forbes |
| 6,421,293 B1 | 7/2002 | Candelier et al. |
| 6,431,456 B2 | 8/2002 | Nishizawa et al. |
| 6,445,619 B1 | 9/2002 | Mihnea et al. |
| 6,456,535 B2 | 9/2002 | Forbes et al. |
| 6,459,634 B1 | 10/2002 | Sher |
| 6,476,636 B1 | 11/2002 | Lien et al. |
| 6,515,509 B1 | 2/2003 | Baxter |
| 6,556,481 B1 | 4/2003 | Hsu et al. |
| 6,602,729 B2 | 8/2003 | Lin |
| 6,633,182 B2 | 10/2003 | Pileggi et al. |
| 6,650,143 B1 | 11/2003 | Peng |
| 6,674,670 B2 | 1/2004 | Jeung |
| 6,678,646 B1 | 1/2004 | McConnell et al. |
| 6,700,151 B2 | 3/2004 | Peng |
| 6,753,590 B2 | 6/2004 | Fifield et al. |
| 6,754,881 B2 | 6/2004 | Kuhlmann et al. |
| 6,777,757 B2 | 8/2004 | Peng et al. |
| 6,856,540 B2 * | 2/2005 | Peng et al. ................. 365/177 |
| 6,862,205 B2 | 3/2005 | Agata et al. |
| 6,898,116 B2 * | 5/2005 | Peng ......................... 365/177 |
| 6,903,984 B1 * | 6/2005 | Tang et al. ............ 365/189.09 |
| 2001/0003374 A1 | 6/2001 | Bohmer et al. |
| 2003/0218920 A1 | 11/2003 | Harari |

FOREIGN PATENT DOCUMENTS

| | | |
|---|---|---|
| JP | 61292295 | 12/1986 |

OTHER PUBLICATIONS

Lombardo, S. et al; Softening of Breakdown in Ultra-Thin Gate Oxide nMOSFET's at Low Inversion Layer Density; 39th Annual International Reliability Physics Symposium; Orlando, FL 2001.

Wu, E.W. et al; Voltage-Dependent Voltage-Acceleration of Oxide Breakdown for Ultra-Thin Oxides; IEEE, 2000.

Rasras, Mahmoud et al; Substrate Hole Current Origin After Oxide Breakdown; IEEE, 2000.

Sune, Jordi et al; Post Soft Breakdown Conduction in SiO2 Gate Oxides; IEEE, 2000.

DeGraaf, C., et al, A Novel High-Density Low-Cost Diode Programmable Read Only Memory, IEEE, 1996.

* cited by examiner

|  |  | VBL (V) | VWL (V) | PROGRAM |
|---|---|---|---|---|
| PROGRAM | SC/SR | 8 | 0 | YES |
|  | SC/UR | 8 | 8 | NO |
|  | UC/SR | 3.3 | 0 | NO |
|  | UC/UR | 3.3 | 8 | NO |
| READ | SC/SR | 1.8 | 0 | ISENSE YES |
|  | SC/UR | 1.8 | 1.8 | NO |
|  | UC/SR | 0 | 0 | NO |
|  | UC/UR | 0 | 1.8 | NO |

FIGURE 4

|  | | VBL (V) | VWL (V) | PROGRAM |
|---|---|---|---|---|
| PROGRAM | SC/SR | $V_{PP}$ | 0 | YES |
|  | SC/UR | $V_{PP}$ | FLOATING | NO |
|  | UC/SR | <0.5 V | 0 | NO |
|  | UC/UR | <0.5 V | FLOATING | NO |
| READ | SC/SR | $V_{DD}$ OR $V_{CC}$ | 0 | $I_{SENSE}$ YES |
|  | SC/UR | $V_{DD}$ OR $V_{CC}$ | $V_{DD}$ OR $V_{CC}$ | NO |
|  | UC/SR | 0 OR FLOAT | 0 | NO |
|  | UC/UR | 0 OR FLOAT | $V_{DD}$ OR $V_{CC}$ | NO |

Columns labeled: 401, 403, 405, 407, 409, 411, 413, 415

FIGURE 15

0.18um/0.13um XPM CX CELL OPERATION

| | | VBL (V) | VWL (V) | PROGRAM |
|---|---|---|---|---|
| PROGRAM | SB/SW | $V_{PP}$ | 0 | YES |
| | SB/UW | $V_{PP}$ | PC TO $V_{PP}/2$ AND FL | NO |
| | UB/SW | <0.5V | 0 | NO |
| | UB/UW | <0.5V | PC TO $V_{PP}/2$ AND FL | NO |
| READ | SB/SW | $V_{DD}$ OR $V_{CC}$ | 0 | $I_{SENSE}$ YES |
| | SB/UW | $V_{DD}$ OR $V_{CC}$ | $V_{DD}$ OR $V_{CC}$ | NO |
| | UB/SW | 0 | 0 | NO |
| | UB/UW | 0 | $V_{DD}$ OR $V_{CC}$ | NO |

$V_{PP}$ = 8~9V FOR $G_{OX}$=32A (0.18um) OR 5-7 FOR $G_{OX}$=20A, OR 3~4.5 V
FOR 10-15A (5 TO 10A THINNER THAN NORMAL STANDARD GATE OXIDE).
$V_{DD}$ = I/O VOLTAGE 3.3V OR 2.5V
$V_{CC}$ = 1.8V FOR 0.18um AND 1.2V FOR 0.13um

FIGURE 18

STEP 1:

XPM P+POLY/BN+ 1T CELL OPERATION

| | | VBL (V)(P+POLY) | VWL (V)(BN+DIFFUSION) | PROGRAM |
|---|---|---|---|---|
| PROGRAM | SC/SR | $V_{BP}$ | $V_{WP}$ | YES |
| | SC/UR | $V_{BP}$ | FLOATING | NO |
| | UC/SR | <0.5V | $V_{WP}$ | NO |
| | UC/UR | <0.5V | FLOATING | NO |
| READ | SC/SR | $V_{RD}$ | 0 | $I_{SENSE}$ YES |
| | SC/UR | $V_{RD}$ | $V_{RD}$ | NO |
| | UC/SR | 0 | 0 | NO |
| | UC/UR | 0 | $V_{RD}$ | NO |

FIGURE 29

XPM N+POLY/BP+ 1T CELL OPERATION

| | | VBL (V)(N+POLY) | VWL (V)(BP+) | N- | PROGRAM |
|---|---|---|---|---|---|
| PROGRAM | SC/SR | $V_{BP}$ | $V_{WP}$ | $V_{WP}$ | YES |
| | SC/UR | $V_{BP}$ | FLOATING | $V_{WP}$ | NO |
| | UC/SR | (0 ~ -) | $V_{WP}$ | $V_{WP}$ | NO |
| | UC/UR | (0 ~ -) | FLOATING | $V_{WP}$ | NO |
| READ | SC/SR | 0 | $V_{RD}$ | $V_{DD}$ OR $V_{RD}$ | $I_{SENSE}$ YES |
| | SC/UR | 0 | 0 | $V_{DD}$ OR $V_{RD}$ | NO |
| | UC/SR | $V_{RD}$ | $V_{RD}$ | $V_{DD}$ OR $V_{RD}$ | NO |
| | UC/UR | $V_{RD}$ | 0 | $V_{DD}$ OR $V_{RD}$ | NO |

FIGURE 32

HIGH DENSITY SEMICONDUCTOR MEMORY CELL AND MEMORY ARRAY USING A SINGLE TRANSISTOR AND HAVING COUNTER-DOPED POLY AND BURIED DIFFUSION WORDLINE

RELATED APPLICATIONS

This application is a continuation-in-part of U.S. patent application Ser. No. 10/765,802 filed Jan. 26, 2004 now U.S. Pat. No. 6,940,751 entitled "HIGH DENSITY SEMICONDUCTOR MEMORY CELL AND MEMORY ARRAY USING A SINGLE TRANSISTOR AND HAVING VARIABLE GATE OXIDE BREAKDOWN", which is a continuation-in-part of U.S. patent application Ser. No. 10/677,613 filed Oct. 1, 2003 now U.S. Pat. No. 6,898,116 entitled "HIGH DENSITY SEMICONDUCTOR MEMORY CELL AND MEMORY ARRAY USING A SINGLE TRANSISTOR HAVING A BURIED N+ CONNECTION", which is a continuation-in-part of U.S. patent application Ser. No. 10/448,505 filed May 30, 2003 now U.S. Pat. No. 6,856,540 entitled "HIGH DENSITY SEMICONDUCTOR MEMORY CELL AND MEMORY ARRAY USING A SINGLE TRANSISTOR" and U.S. patent application Ser. No. 10/133,704 filed Apr. 26, 2002 now U.S. Pat. No. 6,777,757 entitled "HIGH DENSITY SEMICONDUCTOR MEMORY CELL AND MEMORY ARRAY USING A SINGLE TRANSISTOR", to which priority from all is hereby claimed under 35 USC § 120.

TECHNICAL FIELD OF THE INVENTION

The present invention relates to a nonvolatile programmable semiconductor memory, and more particularly to a single transistor memory cell programmed by break down of the transistor gate oxide, and a memory array incorporating such cells.

BACKGROUND OF THE INVENTION

Nonvolatile memory retains stored data when power is removed, which is desirable in many different types of electronic devices. One commonly available type of nonvolatile memory is the programmable read-only memory ("PROM"), which uses word line—bit line crosspoint elements such as fuses, anti-fuses, and trapped charge devices such as the floating gate avalanche injection metal oxide semiconductor ("FAMOS") transistor to store logical information.

An example of one type of PROM cell that uses the breakdown of a silicon dioxide layer in a capacitor to store digital data is disclosed in U.S. Pat. No. 6,215,140 to Reisinger et al. The basic PROM disclosed by Reisinger et al. uses a series combination of an oxide capacitor and a junction diode as the crosspoint element (the term "crosspoint" refers to the intersection of a bitline and a wordline). An intact capacitor represents the logic value 0, and an electrically broken-down capacitor represents the logic value 1. The thickness of the silicon dioxide layer is adjusted to obtain the desired operation specifications. Silicon dioxide has a breakdown charge of about 10 $C/cm^2$ (Coulomb/$cm^2$). If a voltage of 10 volts is applied to a capacitor dielectric with a thickness of 10 nm (resultant field strength 10 mV/cm), a current of about 1 $mA/cm^2$ flows. With 10 volts, this thus results in a substantial amount of time for programming a memory cell. However, it is more advantageous to design the capacitor dielectric to be thinner, in order to reduce the high power loss which occurs during electrical breakdown. For example, a memory cell configuration having a capacitor dielectric with a thickness of 3 to 4 nm can be operated at about 1.5 V. The capacitor dielectric does not yet break down at this voltage, so that 1.5 V is sufficient to read data from the memory cell. Data are stored, for example, at 5 V, in which case one cell strand in a memory cell configuration can be programmed within about 1 millisecond. The energy loss which occurs in this case per $cm^2$ of capacitor dielectric is then about 50 Watts (10 Coulomb*5 V). If the desired power loss is about 0.5 W, about 100 seconds are required to program a 1 Gigabit memory. If the permissible power losses are higher, the programming can be carried out correspondingly more quickly.

Some types of nonvolatile memory are capable of being repeatedly programmed and erased, including erasable programmable read only semiconductor memory generally known as EPROM, and electrically erasable programmable read only semiconductor memory generally known as EEPROM. EPROM memory is erased by application of ultraviolet light and programmed by application of various voltages, while EEPROM memory is both erased and programmed by application of various voltages. EPROMs and EEPROMs have suitable structures, generally known as floating gates, that are charged or discharged in accordance with data to be stored thereon. The charge on the floating gate establishes the threshold voltage, or $V_T$, of the device, which is sensed when the memory is read to determine the data stored therein. Typically, efforts are made to minimize gate oxide stress in these types of memory cells.

A device known as a metal nitride oxide silicon ("MNOS") device has a channel located in silicon between a source and drain and overlain by a gate structure that includes a silicon dioxide layer, a silicon nitride layer, and an aluminum layer. The MNOS device is switchable between two threshold voltage states $V_{TH(high)}$ and $V_{TH(low)}$ by applying suitable voltage pulses to the gate, which causes electrons to be trapped in the oxide-nitride gate ($V_{TH(high)}$) or driven out of the oxide-nitride gate ($V_{TH(low)}$). Again, efforts are made to minimize gate oxide stress in these types of memory cells.

A junction breakdown memory cell that uses a stored charge on the gate of a gate controlled diode to store logic 0 and 1 values is disclosed in U.S. Pat. No. 4,037,243 to Hoffman et al. Charge is stored on the gate by using a capacitance formed between the p-type electrode of the gate controlled diode and the gate electrode. Charge storage is enhanced by using a composite dielectric in the capacitor formed from silicon dioxide and silicon nitride layers in place of silicon dioxide. The application of an erase voltage to the electrode of the gate controlled diode causes the oxide-nitride interface surface to fill with negative charge, which is retained after the erase operation is completed. This negative interface charge causes the gate controlled diode to operate in an induced junction mode even after the erase voltage is removed. When the gate controlled diode is thereafter read, it exhibits field-induced junction breakdown of its channel and a saturation current flows. The field induced junction breakdown voltage is less than the metallurgical junction breakdown voltage. However, the application of a write voltage to the electrode of the gate controlled diode causes the silicon dioxide/silicon nitride interface to fill with positive charge, which is retained after the write operation is completed. When the gate controlled diode is thereafter read, it will not break down because no channel exists. Only a slight current flows. The different current flows are sensed and indicate different logic states.

Improvements in the various processes used for fabricating the various types of nonvolatile memory tend to lag improvements in widely used processes such as the advanced CMOS logic process. For example, processes for devices such as flash EEPROM devices tend to use 30% more mask steps than the standard advanced CMOS logic process to produce the various special regions and structures required for the high voltage generation circuits, the triple well, the floating gate, the ONO layers, and the special source and drain junctions typically found in such devices. Accordingly, processes for flash devices tend to be one or two generations behind the standard advanced CMOS logic process and about 30% more expensive on a cost-per-wafer basis. As another example, processes for antifuses must be suitable for fabricating various antifuse structures and high voltage circuits, and so also tend to be about one generation behind the standard advanced CMOS process.

Generally, great care is taken in the fabrication of the silicon dioxide layer used in metal-oxide-silicon (MOS) devices such as capacitors and transistors. The high degree of care is necessary to ensure that the silicon dioxide layer is not stressed during manufacture or subsequent normal operation of the integrated circuit, so that the desired device characteristics are attained and are stable over time. One example of how much care is taken during fabrication is disclosed in U.S. Pat. No. 5,241,200 to Kuroda, which discloses the use of a diffused layer and a shunt to discharge charges accumulated in the word line during a wafer fabrication process. Avoiding this charge accumulation ensures that a large electric field is not applied to the gate insulating film, so that variations in the characteristics of transistors using the word line as their gate wiring line and degradation and breakdown of the gate insulating film are prevented.

An example of how much care is taken in circuit design to avoid stressing the silicon dioxide layer of a transistor during normal circuit operation is disclosed in U.S. Pat. No. 6,249,472 to Tamura et al. Tamura et al. disclose an antifuse circuit having an antifuse in series with a p-channel MOS transistor in one embodiment and in series with an n-channel MOS transistor in another embodiment. While the antifuse is fabricated without the additional film manufacturing processes typically required for fabricating antifuse circuits, Tamura et al. poses another problem. When the antifuse is shorted out, the series-connected transistor is exposed to a high voltage sufficient to break down the silicon dioxide layer of the transistor. Tamura et al. disclose the addition of another transistor to the circuit to avoid exposing the first transistor to the break down potential.

The observations above generally indicate that there are still disadvantages with each of the prior art memory technologies.

BRIEF DESCRIPTION OF THE DRAWINGS

FIG. 4 is a table of voltages showing the operation of the memory cell of FIGS. 1–3.

FIG. 15 is a table of voltages showing the operation of the memory cell of FIGS. 12–14.

FIG. 18 is a table of voltage showing the operation of the memory cells of FIG. 16.

FIG. 29 shows the operation table of the embodiment of FIG. 28.

FIG. 32 shows the operation table of the embodiment of FIG. 31.

DETAILED DESCRIPTION

A semiconductor memory cell having a data storage element constructed around a gate oxide is used to store information by stressing the ultra-thin dielectric into breakdown (soft or hard breakdown) to set a leakage current level of the memory cell. The memory cell is read by sensing the current drawn by the cell. A suitable ultra-thin dielectric is the high quality gate oxide of about 10–50 Å thickness or less used in a transistor, as is commonly available from presently available advanced CMOS logic processes. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is related to other types of gate oxide breakdown based non-volatile memory designs developed by the present inventor and assigned to the same assignee as the present invention. Examples are shown in U.S. patent application Ser. No. 09/955,641 filed on Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed on Dec. 17, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 09/982,034 filed on Oct. 17, 2001 entitled "SMART CARD HAVING NON-VOLATILE MEMORY FORMED FROM LOGIC PROCESS", and U.S. patent application Ser. No. 09/982,314 filed on Oct. 17, 2001 entitled "REPROGRAMMABLE NON-VOLATILE OXIDE MEMORY FORMED FROM LOGIC PROCESS", each of which is hereby incorporated by reference. However, in each of the memory cells described above, the cell size is relatively large. The present invention provides a much smaller cell size, thereby allowing a higher density.

Figure 1:
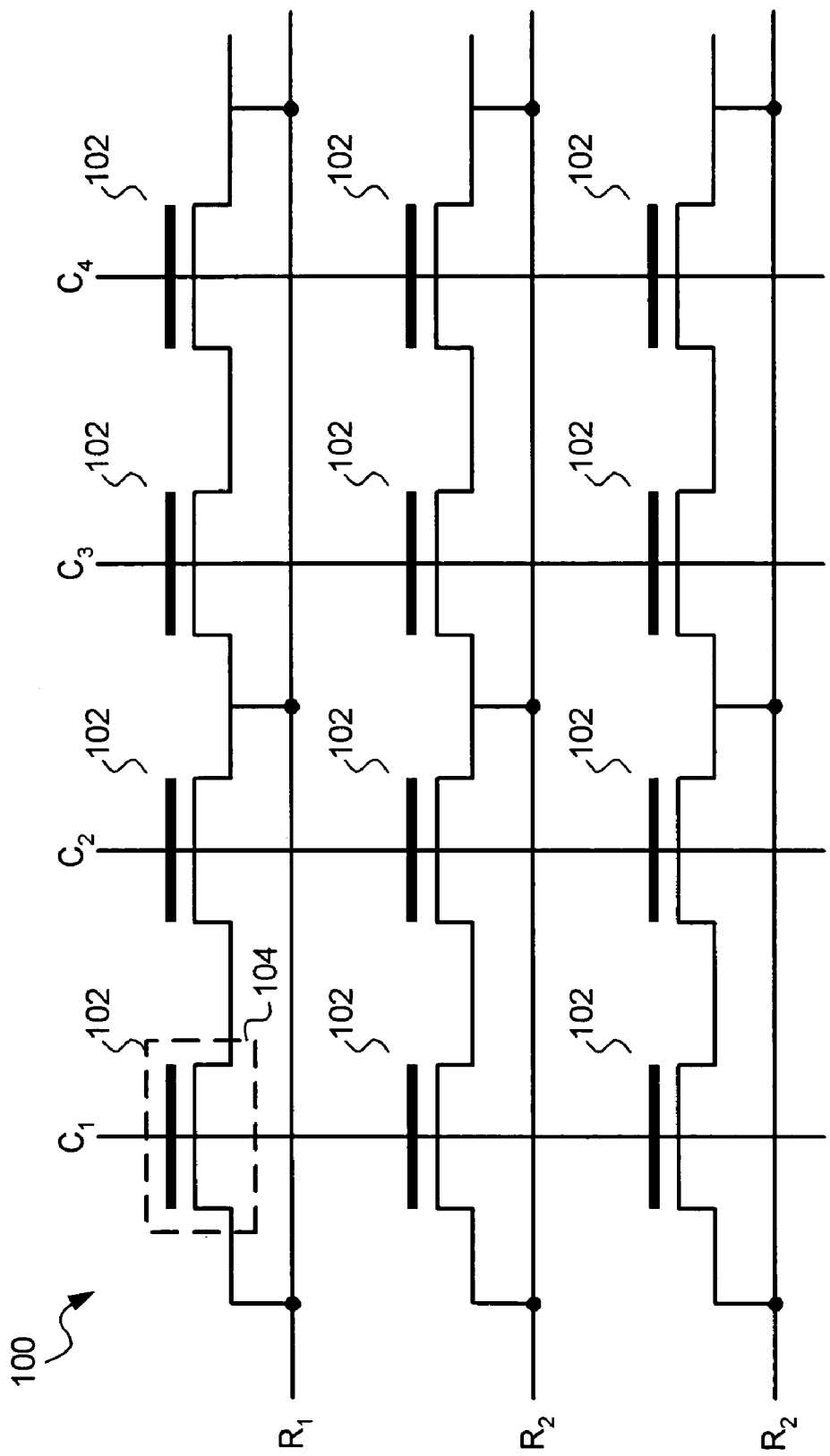
FIG. 1 is a schematic circuit diagram of a portion of a memory array in accordance with the present invention.

FIG. 1 shows an example of a memory array 100 formed in accordance of with the present invention. The memory array 100 is a four column by three row array, however, it can be appreciated that the array can be any arbitrary size. The memory array 100 includes twelve memory cells 102, each of which comprises a MOS transistor 104. The memory cell 102 at, for example, the crosspoint of the first row $R_1$ and the first column $C_1$ includes a MOS transistor 104 having its gate connected to a column line $C_1$ (also referred to herein as a "bitline" or "column bitline"), its source connected to a row line $R_1$ (also referred to herein as a "wordline" or "row wordline"), and its drain left floating connected to a drain of an adjacent memory cell 102. Alternatively, as will be seen below, since there is no current through the drains, the drains of adjacent devices need not be connected where a shallow trench isolation (STI) is used to isolate two memory cells As will be seen below, during the programming step, a relatively large voltage is applied to the gate of the transistor 102 (through the bitline $C_x$, where x=1 to M and M is the total number of columns) of the selected column to break down the gate oxide of the transistor 102. The other memory cells 102 shown in FIG. 1 are also formed from, in one embodiment, identical transistors 102 at the crosspoints of the column bitlines $C_x$ and row wordlines $R_y$, where y=1 to N and N is the total number of columns.

The use of transistors 102 as data storage elements in the memory array 100 of FIG. 1 is advantageous because the transistors can be fabricated using many conventional CMOS processes using only a single polysilicon deposition step, without adding any mask steps to them. This is in contrast to "floating gate" type flash memory, which requires at least two polysilicon layers. Further, with modern technological advances, the size of a transistor can be made very small. For example, current 0.18 micron, 0.13 micron, and smaller line width processes would greatly increase the density of the flash memory.

Although only a four by three memory array 100 is shown, in practice such memory arrays contain on the order of about one gigabit or more of memory cells when fabricated using, for example, an advanced 0.13 μm CMOS logic process. Even larger memories will be realized as CMOS logic processes improve further. The memory array 100 in practice is organized into bytes and pages and redundant rows (not shown), which may be done in any desired manner. Many suitable memory organizations are well known in the art.

Figure 2:
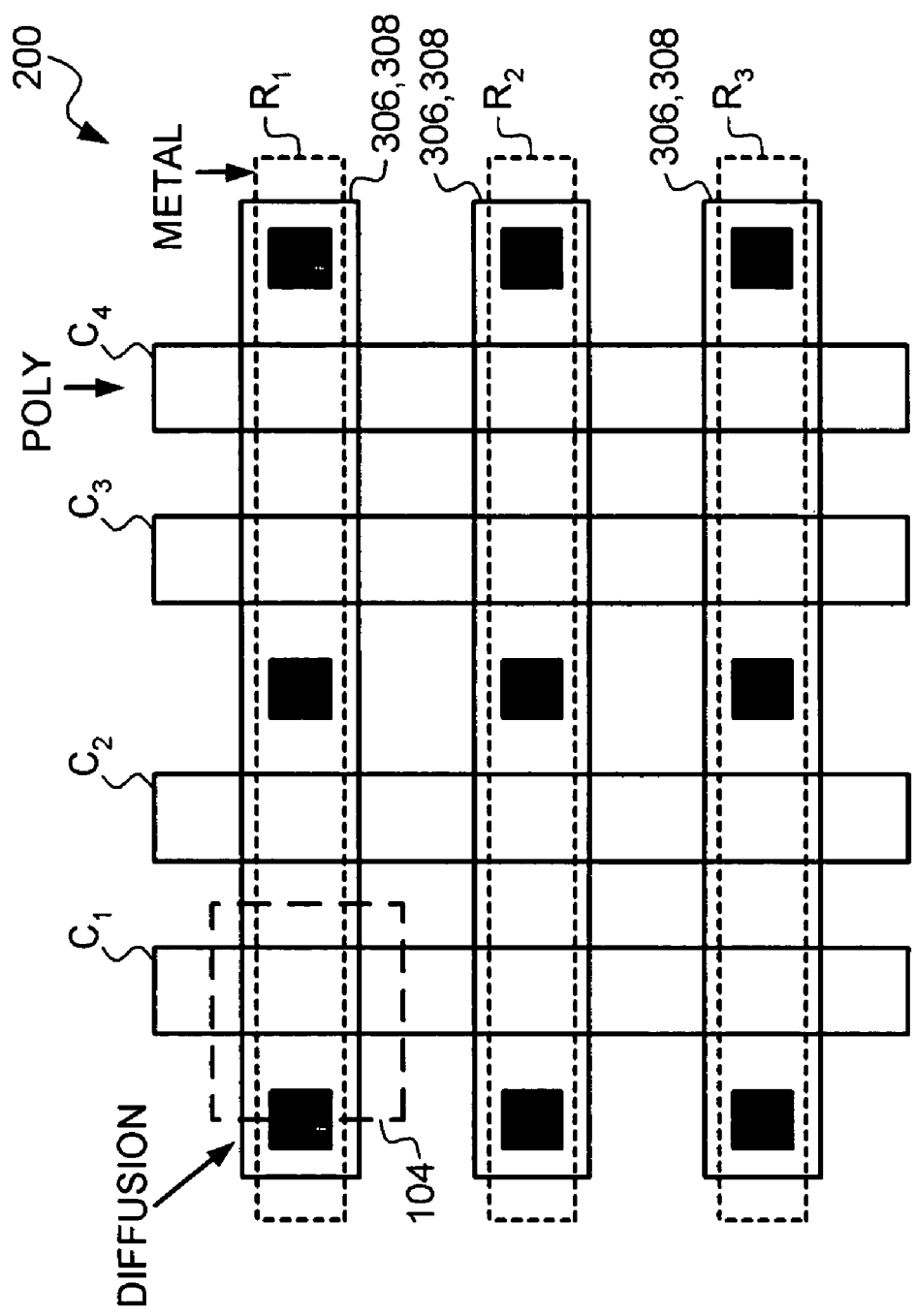
FIG. 2 is a partial layout diagram of a portion of the memory array represented by FIG. 1.
Figure 3:
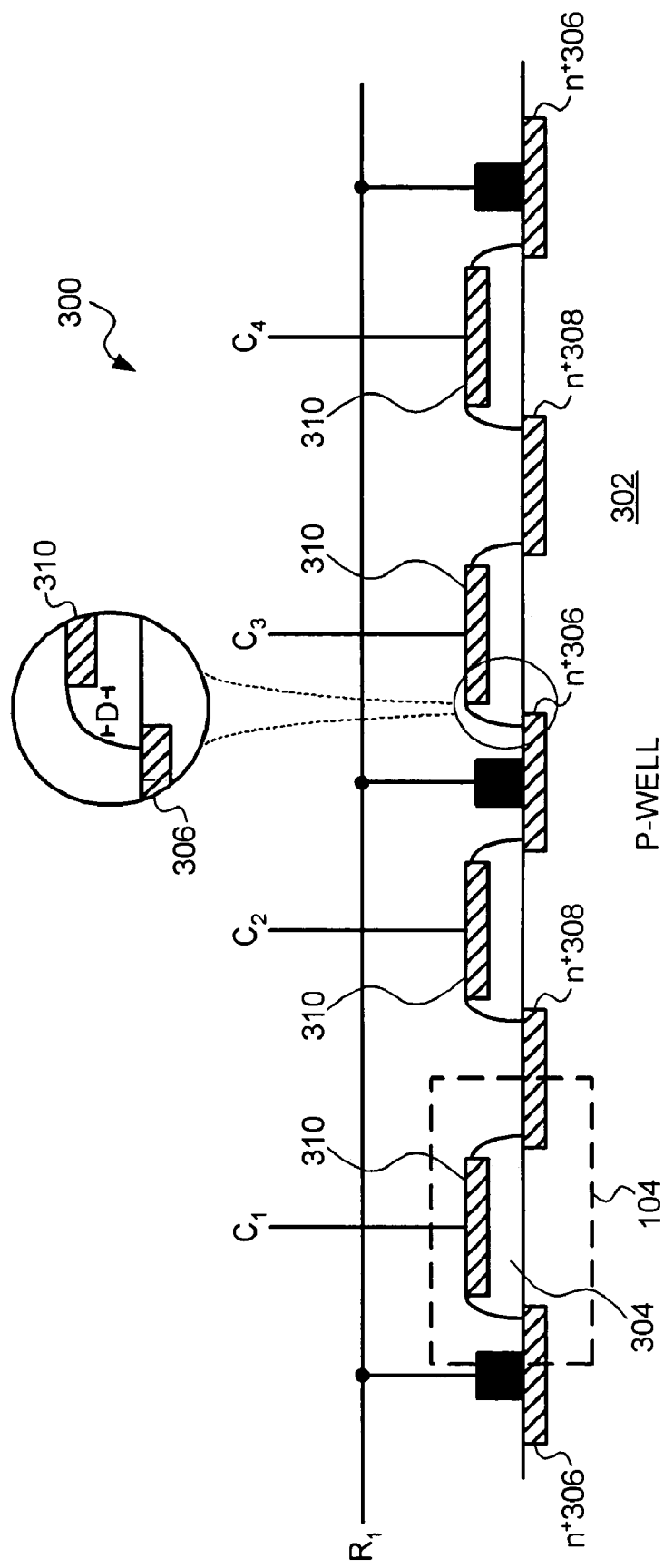
FIG. 3 is a cross-section diagram of an integrated circuit structure for the portion of the memory array corresponding to FIG. 2.

FIG. 2 shows a partial layout diagram 200 for a portion of the memory array 100, and FIG. 3 presents a cross-section of an illustrative MOS integrated circuit 300 showing the principal structural aspects thereof corresponding to the memory cells 102 formed by transistors 104 in accordance with the layout diagram of FIG. 2. The layout diagram of FIG. 2 is suitable for an advanced CMOS logic process. The term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms (50 A for 0.25 um, 30 A for 0.18 um, 20 A for 0.13 um, 16 A for 0.09 um process) thick is used.

The memory array 100 preferably is laid out in a grid in which the column lines such as $C_1$, $C_2$, $C_3$, and $C_4$ are orthogonal to the row lines such as $R_1$, $R_2$, and $R_3$, as well as the diffused source and drains of the transistors 104. The transistor 104 at the crosspoint of the row line $R_1$ and the column line $C_1$ is formed in a p-well active region 302 in the following manner.

An ultra-thin gate oxide layer 304 is formed by either deposition or thermal oxidation. This is followed by a deposition and doping of a polysilicon layer, which is patterned using a gate mask containing patterns for the column bitlines $C_1$, $C_2$, $C_3$, and $C_4$, which also serve as gates 310 for the transistors 104. Alternatively, the column bitlines may be separate structure that are connected to the gates 310 of the transistors through column bitline segments. The various source and drain regions are formed by conventional process steps (implants, spacers, and n+ source/drain implants), creating the n+ source regions 306 and n+ drain regions 308. Importantly, it should be noted that the polysilicon gate 310 for the transistors 104 should not overlap with the n+ source/drain regions. Thus, a lightly doped drain structure is not employed. As will be seen below, by not having the polysilicon gate 310 overlap or proximal to the n+ source/drain regions, during programming, the polysilicon gate will not short directly to the n+ source/drain regions.

Further, contacts (also referred to as row wordline segments) to n+ source regions 306 are formed to allow connection with the row lines $R_y$. The row lines $R_y$ are formed from a metal deposition that is subsequently etched. Further, an interlayer dielectric (not shown) is deposited over the polysilicon layer. Thus, the contact vias connecting the metal row lines $R_y$ to the n+ source regions 306 are formed within the interlayer dielectric.

The operation of the memory array 100 is now explained with reference to the illustrative voltages shown in FIG. 4. It will be appreciated that the voltages are illustrative, and that different voltages are likely to be used in different applications or when different process technologies are used. During programming, the various memory cells in the memory array 100 are exposed to one of four possible programming voltage combinations, which are shown on lines 401, 403, 405, and 407 of FIG. 4. Read voltages are shown on lines 409, 411, 413, and 415. Assume that a memory cell 102 is selected for programming and is located at the crosspoint of $R_1$ and $C_1$. The selected memory cell 102 is referred to as at the selected row and selected column ("SR/SC"). As shown on line 401, the voltage on the selected wordline $R_1$ (designated as $V_{wordline}$ or "voltage on the wordline") is 0 volts and the voltage on the bitline $C_1$ (designated as $V_{bitline}$ or "voltage on the bitline") is a programming voltage ($V_{PP}$), in this case 8 volts. Thus, the voltage across the gate (the bitline $C_1$) of the transistor 104 and the source (the wordline $R_1$) of the transistor 104 is 8 volts. The gate oxide 304 of the transistor 104 is designed to break down at this potential difference, which programs the memory cell. During programming, the voltage potential breaks down the gate oxide and results in a leakage current through the gate oxide into the underlying substrate and collected mostly by the N+ source/drain, which is connected to ground. Further, the result of this is that a programmed n+ region 501 (see FIG. 5) is formed in the p-well 302 between the n+ source region 306 and the n+ drain region 308 of the transistor 104.

It can be appreciated that the precise magnitude of voltages applied is dependent upon the thickness of the gate oxide and other factors. Thus, for example, for a 0.13 micron CMOS process, the gate oxide is typically thinner, thereby requiring a lower voltage differential between the selected wordline and the selected bitline. In one embodiment, where a 0.13 micron CMOS process is used, the bitline $C_1$, and the unselected word line has a voltage of 4.5 volts and the unselected bitline $R_1$ has a voltage of between 0 and 1.2 volts.

With $R_1$ and $C_1$ being the selected row and column, consider the impact on the memory cell 102 at the crosspoint of a selected row and an unselected column ("SR/UC"), e.g., $R_1$ and $C_2$. As shown on line 405, the voltage on the wordline $R_1$ is 0 volts and the voltage on the unselected bitline $C_2$ is 0 or floating. This causes a relatively low potential difference across the gate oxide 304 of the transistor 104, which is insufficient to break down the gate oxide for the transistor 104 at the crosspoint. The memory cell 102 does not program under these conditions.

With $R_1$ and $C_1$ being the selected row and column, consider the impact on the memory cell 102 at the crosspoint of a selected column and an unselected row ("UR/SC"), e.g. $R_2$ and $C_1$. As shown on line 403, the voltage on the unselected wordline $R_2$ is floating or $V_{PP}$ and the voltage on the bit line $C_1$ is at $V_{PP}$ (8 volts in this example). This causes a relatively low potential difference across the gate oxide 304 of the transistor 104. The memory cell 102 does not program under these conditions.

With $R_1$ and $C_1$ being the selected row and column, consider the impact on the memory cell 102 at the crosspoint of an unselected column and an unselected row ("UR/UC"), e.g. $R_2$ and $C_2$. As shown on line 407, the voltage on the unselected wordline $R_2$ is floating or $V_{PP}$ and the voltage on the unselected bitline $C_2$ is 0 volts or floating. This causes a negative potential difference across the gate 304 and the N+ source/drain of the transistor 104. Since the N+ source/drain is positive and gate is negative, the higher voltage on the source/drain will not pass under the gate, so the memory cell 102 does not program under these conditions. Further, the voltage on the unselected wordline could be biased to an intermediate voltage, such as 2V to 6V to prevent the cell from being programmed. However, the programmed cell will cause a leakage current from the selected bitline to the unselected wordline. If the unselected bit line is floating, the leakage current will charge it up, which causes the voltage to raise up in the bitline. By biasing the unselected wordlines $R_x$ to $V_{PP}$, we can prevent this leakage and thus the charge time of the selected bitline through programmed cells can be reduced.

Figure 5:
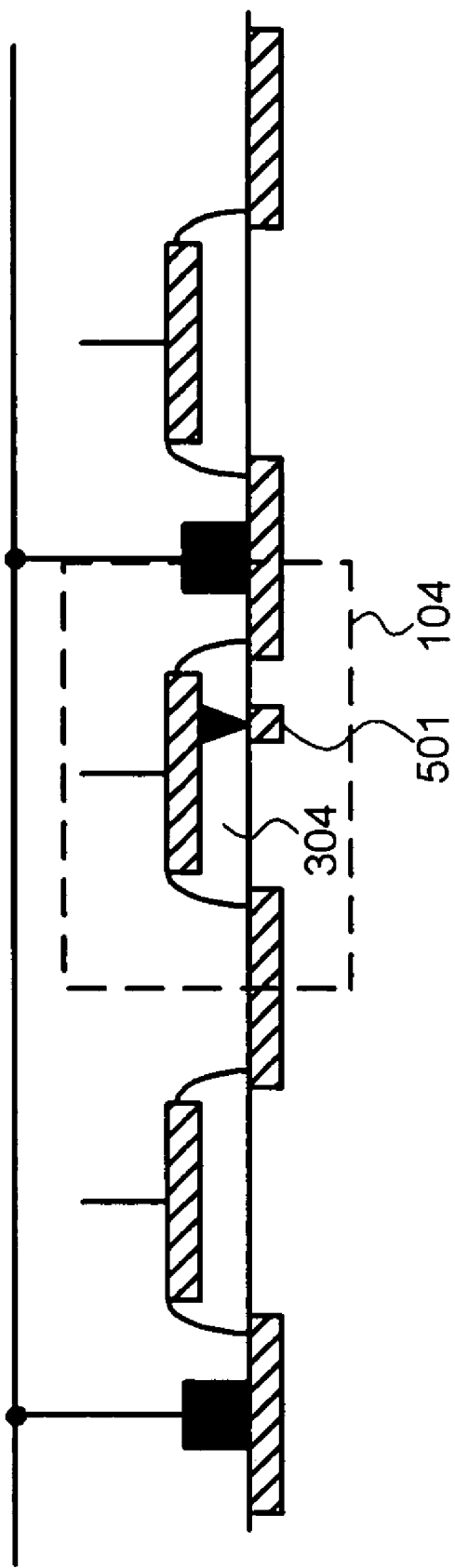
FIG. 5 is a cross-section diagram of a memory cell that has been programmed.

After a memory cell 102 has been programmed by breaking down the gate oxide 304, the physical characteristics of the cell 102 is changed. Turning to FIG. 5, a transistor 104 of the memory cell 102 has been programmed. During programming, a programmed n+ region 501 is formed underneath the gate of the transistor 104. This programmed n+ region 501 is formed as current (during the programming process) pierces through the gate oxide 304 and deposits into the substrate (p-well 302).

Although difficult to view clearly in FIG. 3, as noted above, the polysilicon gate 310 for the transistors 104 should not overlap vertically with the n+ source/drain regions 306 and 308. Indeed, the separation laterally between the gate 310 and the n+ source region 306 and n+ drain region 308, by for example the use of a CMOS LDD spacer, should be sufficient to prevent short circuiting during programming. As seen in FIG. 3, this lateral separation is designated as a lateral distance D. In one embodiment, the lateral distance D is between 0.02 microns to 0.08 microns as formatted by a LDD dielectric spacer in CMOS logic devices. By not having the polysilicon gate overlap or proximal to the n+ source/drain regions, during programming, the polysilicon gate will not short directly to the n+ source/drain regions. Instead, the programmed n+ region 501 is formed. Further, alternative methods by which short circuiting is avoided between the gate 310 and the n+ regions 306 and 308 may be utilized. As but one example, the gate oxide near the n+ regions 306 and 308 may be made thicker by poly gate sidewall oxidation after the gate poly etch. It can be appreciated that other methods are also suitable.

Figure 6:
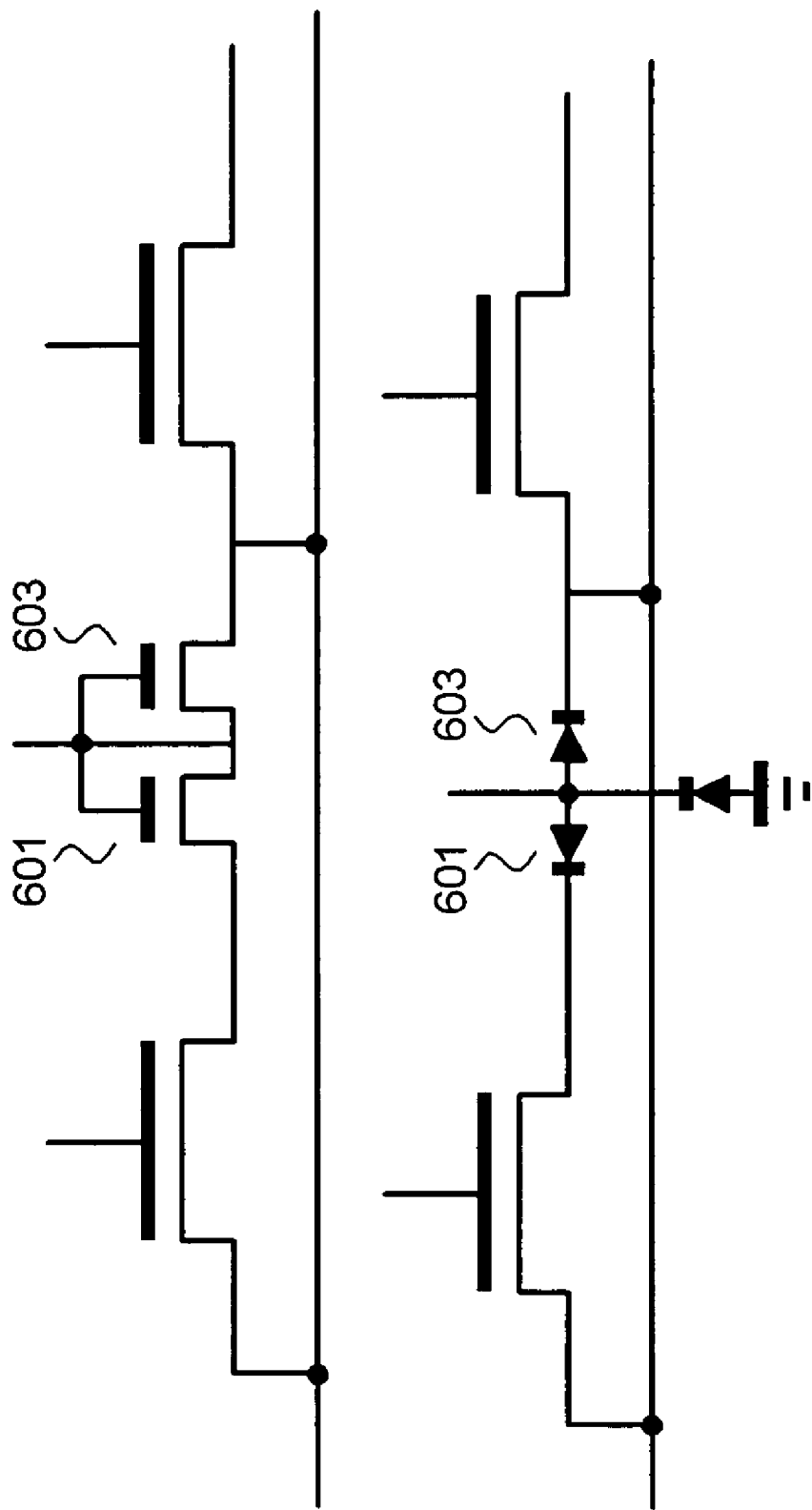
FIG. 6 is a schematic circuit diagram of a memory cell that has been programmed.

The programmed memory cell of FIG. 5 can be seen in schematic form in FIG. 6. The result of programming a memory cell is the formation of two gated diodes 601 and 603. The gated diodes 601 and 603 prevent current from flowing from the wordlines $R_y$ to the bitlines $C_x$. However, current will be allowed to flow from the bitlines $C_x$ to the wordlines $R_y$ during the read operation since the positive gate bias can induce a n+ inversion, which can make the connection to the N+ source/drain regions.

The memory array 100 is read in the following manner. A read select voltage $V_{RD}$ (for example 1.8 volts) is placed on the selected column bitline ("SC") and a read select voltage of 0 volts is placed on the selected row wordline ("SR").

Note that these voltages are for a typical 0.18 micron CMOS process. Lower voltages would be typically used for smaller more advanced CMOS processes. For example, for a 0.13 micron CMOS process, the read select voltage on the selected column bitline may be approximately 1.2 volts.

Assume that $R_1$ and $C_1$ are the selected row and column ("SC/SR") and that the memory cell 102 at that crosspoint is programmed. As shown on line 409, 1.8 volts (a read select voltage) is applied via bitline $C_1$ to the gate of the transistor 104 and 0 volts is applied to the source via the wordline $R_1$. This causes a current to flow from the bitline $C_1$, through the gate oxide of the transistor 104, and out through the wordline $R_1$, which is ground to zero. By detecting the current on the bitline, it can be determined whether the memory cell 102 is programmed. If the memory cell 102 is not programmed, no current will flow, which indicates that the memory cell is not programmed.

With $R_1$ and $C_1$ being the selected row and column for the read operation, consider the impact on the memory cell 102 at the crosspoint of a selected column and an unselected row ("UR/SC"), e.g. $R_2$ and $C_1$. As shown on line 411, 1.8 volts is on the selected bitline $C_1$ and the source via the unselected wordline $R_2$ is held to floating or $V_{RD}$. There is no voltage potential across the transistor and no current flow, which indicates that the memory cell is not programmed. By biasing the unselected wordline $R_2$ to $V_{RD}$, the charge time of the selected bitline through programmed cells can be reduced. This is because if the unselected wordline is floating, it will take some time to charge it up to by the selected bit through the programmed cell.

With $R_1$ and $C_1$ being the selected row and column for the read operation, consider the impact on the memory cell 102 at the crosspoint of an unselected column and a selected row ("SR/UC"), e.g. $R_1$ and $C_2$. As shown on line 413, 0 volts is on the unselected bitline $C_2$ and 0 volts is applied to the source via the selected wordline $R_1$. There is no voltage potential across the transistor and no current flow, which indicates that the memory cell is not programmed.

With $R_1$ and $C_1$ being the selected row and column for the read operation, consider the impact on the memory cell 102 at the crosspoint of an unselected column and an unselected row ("UR/UC"), e.g. $R_2$ and $C_2$. As shown on line 415, 0 volts is on the unselected bitline $C_2$ and the source via the unselected wordline $R_2$ is held to floating or $V_{RD}$. Even for the cell that was previously programmed, and the programmed cell acts like a reversed biased diode, so there is no current going from the unselected wordline (1.8V) to the unselected bitline (0V), which indicates that the memory cell is not programmed.

Thus, as seen above, during the read cycle, no current is drawn by memory cells at crosspoints having either an unselected row or an unselected column. Note that the unselected wordlines may be left floating. This embodiment will tend to reduce leakage current through the wordlines, as well as allowing the use of smaller word line drivers, thereby saving integrated circuit space.

Moreover, in an alternative embodiment, in order to increase the n+ source/drain junction breakdown voltage and reduce junction leakage in the case of an unselected wordline charged to $V_{PP}$ either from the selected word line through prior programmed cells or through a word line driver, a high energy, low dose n+ implant can be used. The implant may be a standard n+ electrostatic discharge protection implant from a conventional CMOS process or other existing implant steps, thus staying within standard CMOS logic process. Still, in other embodiments, a special implant step may be added to optimize the implanting.

Figure 12:
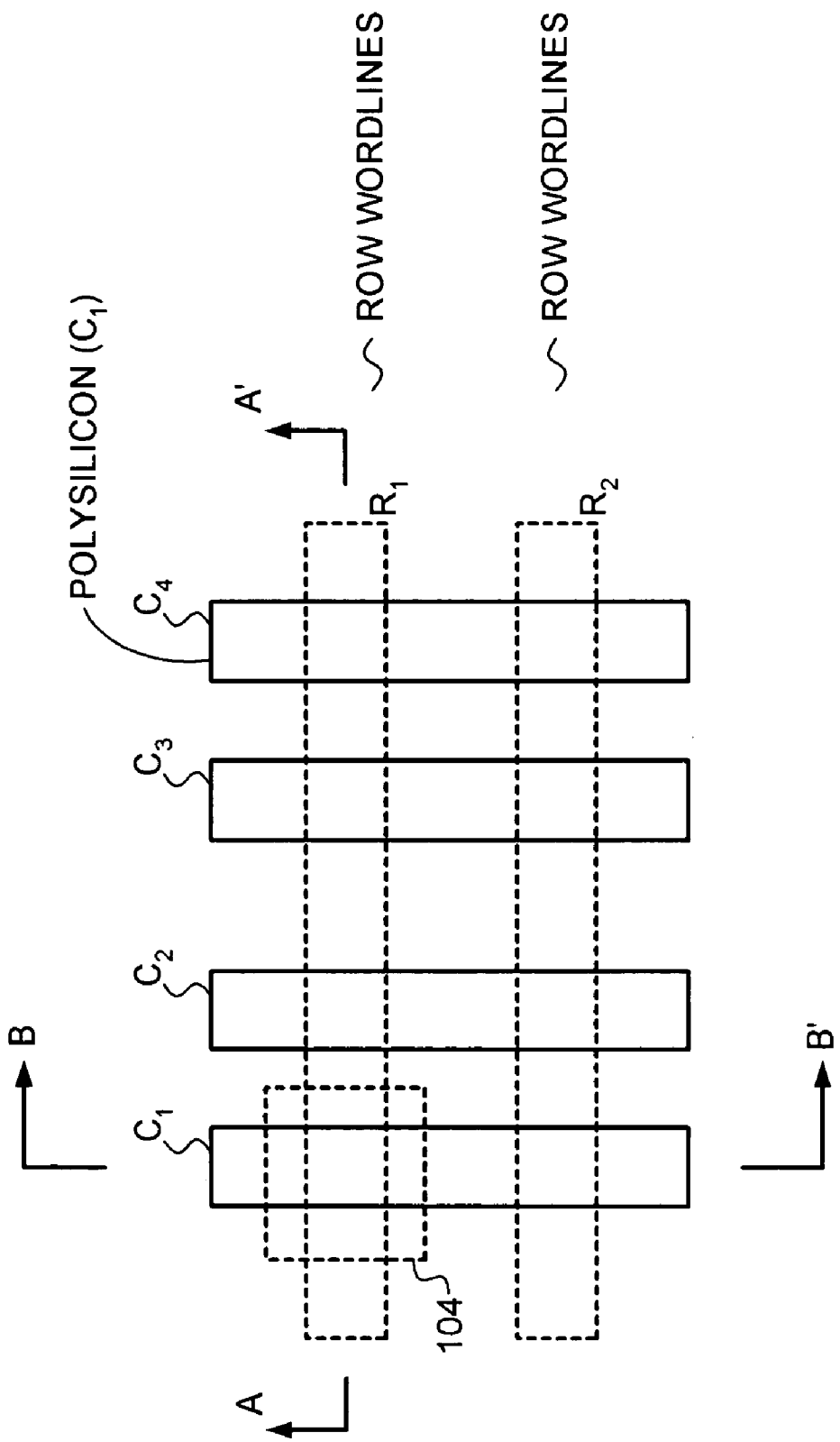
FIG. 12 is a is a partial layout diagram of a portion of the memory array formed in accordance with an alternative embodiment of the present invention.
Figure 13:
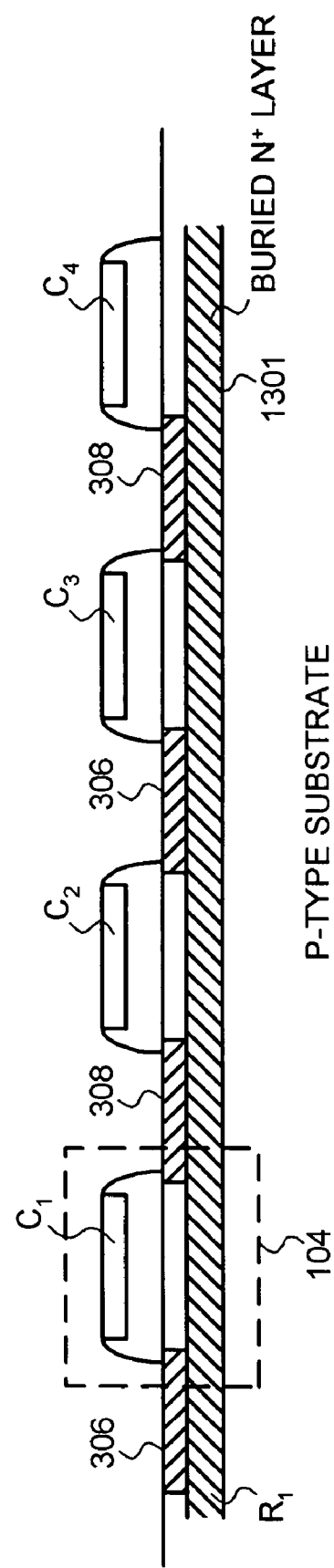
FIG. 13 is a cross-section diagram of an integrated circuit structure for the portion of the memory array corresponding to FIG. 12 taken along line A–A'.
Figure 14:
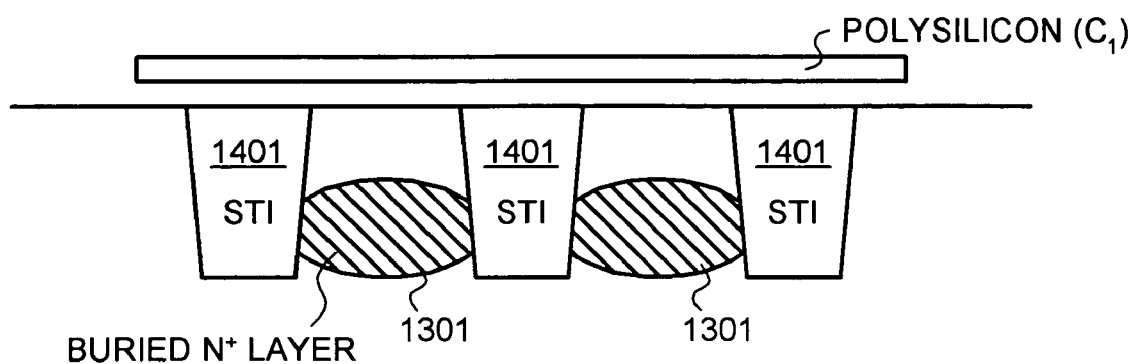
FIG. 14 is a cross-section diagram of an integrated circuit structure for the portion of the memory array corresponding to FIG. 12 taken along line B–B'.

An alternative embodiment of the present invention is shown in FIGS. 12–14. The operation tabitlinee of this alternative embodiment is shown in FIG. 15. In the alternative embodiment of FIG. 12, the row wordlines $R_1$ and $R_2$ are not formed from a metal deposition as is shown in the embodiment of FIG. 2. Instead, the row wordlines $R_1$ and $R_2$, and in general all of the row wordlines $R_y$, are formed from a buried n+ layer formed in the substrate. The buried n+ layer thus replaces the metal wordlines discussed above. Because of this, there is no need for metal contact to connect the row wordlines $R_y$ to the N+ source regions 306. In general, this allows for higher density integration of the memory array.

For clarity purposes, it should be noted that the buried N+ layer forming the row wordlines $R_1$ and $R_2$ of FIG. 12 is shown, while the N+ source regions 306 and the n+ drain regions 308 are not shown in the top view of FIG. 12.

FIG. 13 is a cross-section view of the silicon substrate taken along line A–A' of FIG. 12. The buried N+ layer 1301 is formed just underneath the N+ source regions 306 and N+ drain regions 308. Indeed, the N+ source regions 306 are in electrical contact with the buried N+ layer 1301. Thus, the buried n+ layer 1301 replaces the metal row line $R_y$ of FIG. 2. Additionally, the n+ drain regions 308 are also in contact with the buried N+ layer 1301.

FIG. 14 shows a cross-section view of the substrate taken along ine B–B' of FIG. 12. In this embodiment, shallow trench isolations ("STI") 1401 serve to separate and isolate the memory cells. The buried n+ layer 1301 is shown under the surface of the substrate, but still separated by the shallow trench isolations 1401.

The formation of the buried n+ layers 1301 will require additional masking and implantation steps. In one embodiment, or arsenic may be used as the dopent instead of phosphorous in order to limit the diffusion layer thickness in the deep submicron process. The buried n+ layer 1301 can be formed using high energy ion implantation either before or after the formation of the thin gate oxide layer and/or the polysilicon deposition. Alternatively, the buried n+ layer 1301 may be deposited using an epitaxial deposition technique. Further, in order to be CMOS logic process compatible, the lightly doped P-type implant is the same as the logic NMOS threshold voltage $V_t$ implant.

Compared to the embodiment shown in FIG. 2, the buried n+ layer 1301 can reduce the size of the memory array by 50% or more due to the smaller critical dimensions possible with the photolithography steps relative to metal and contact via formulation.

Finally, FIG. 15 shows the operation table for the embodiment of FIGS. 12–14. The programming voltage $V_{PP}$ is approximately 8–9 volts for a gate oxide thickness of 32 angstroms or 5–6 volts for gate oxide thickness of 20 angstroms. Typically, the $V_{DD}$ is the input/output voltage and is on the order of 3.3 volts or 2.5 volts. The power supply voltage of $V_{CC}$ is typically 1.8 volts for 0.18 micron process or 1.2 volts per 0.13 micron process. As you can see, there can be a range of voltages used in order to form the programming and reading functions. Note also that at lines 405 and 407 (for the unselected columns), the voltage on the column bitline $V_{bitline}$ is less than 0.5 volts. If the unselected column bitline is greater than 0.5 volts (in other words $V_t$), the previously programmed cells along the common column bitline will have a large leakage current through the programmed cells. By limiting $V_{bitline}$ to under $V_t$, this leakage current can be reduced or eliminated.

Various studies of oxide breakdown, which were performed in contexts different than the memory cells 102 shown in the array 100, indicate suitable voltage levels for breaking down ultra-thin gate oxides and establishing that the breakdown is controllable. When an ultra-thin gate oxide is exposed to voltage-induced stress, breakdown in the gate oxide occurs. Although the actual mechanisms leading to the intrinsic breakdown of gate oxide are not well understood, the breakdown process is a progressive process passing through a soft breakdown ("SBD") stage followed by a hard breakdown ("HBD") stage. One cause of breakdown is believed to be oxide defect sites. These may act alone to cause breakdown, or may trap charges and thereby cause high local fields and currents and a positive feedback condition that leads to thermal runaway. Improved fabrication processes resulting in fewer oxide defects are reducing the occurrence of this type of breakdown. Another cause of breakdown is believed to be electron and hole trapping at various sites even in defect-free oxide, which also leads to thermal runaway.

Figure 7:
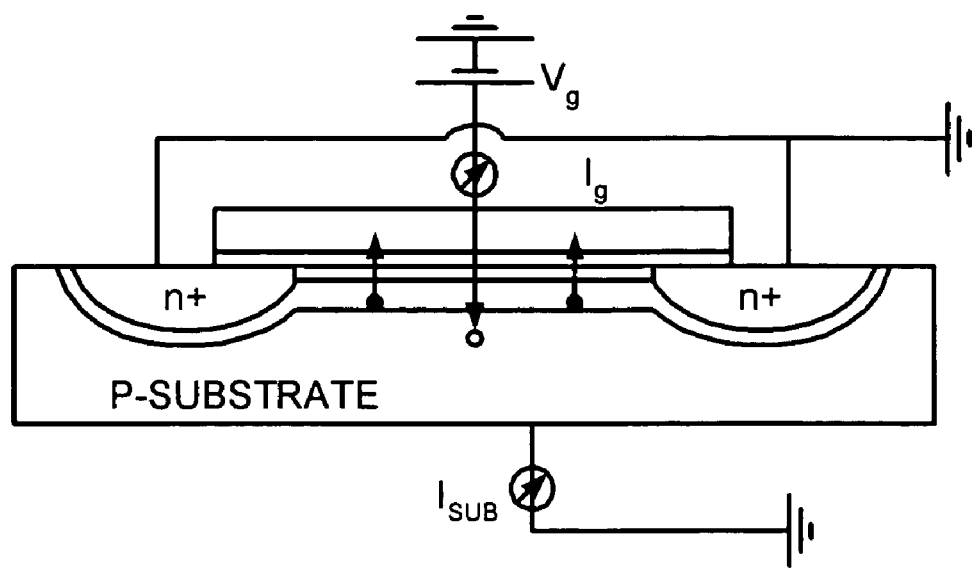
FIG. 7 is a cross-section diagram of an experimental setup.
Figure 8:
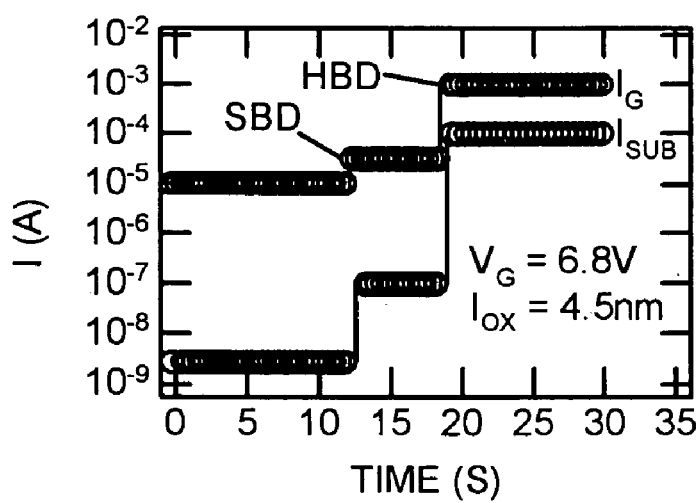
FIG. 8 is a graph showing the effect of a constant voltage stress on an ultra-thin gate oxide.

Rasras et al. performed a carrier separation experiment which demonstrated that, under positive gate bias, impact ionization of the electrons in the substrate is the dominant source of the substrate hole current. Mahmoud Rasras, Ingrid De Wolf, Guido Groeseneken, Robin Degraeve, Herman e. Maes, Substrate Hole Current Origin after Oxide Breakdown, IEDM 00-537, 2000. A constant voltage stress experiment was performed on ultra-thin oxide in an arrangement in which channel inversion was involved, and established that both SBD and HBD may be used for storing data, and that a desired degree of SBD or HBD may be obtained by controlling the time over which the gate oxide storage element is stressed. FIG. 7 shows a schematic cross-sectional representation of the experimental setup. The effect of the constant voltage stress on the ultra-thin gate oxide is shown in the graph of FIG. 8, in which the x-axis is time in seconds and the y-axis is current in amperes expressed logarithmically. FIG. 8 shows the gate and substrate hole current measured before and after soft and hard breakdown under constant voltage stress. For roughly 12.5 seconds, the total current is substantially constant and dominated by an electron current as measured by $I_g$. The leakage is believed to be due to Fowordlineer-Nordheim ("FN") tunneling and stress-induced leakage current ("SILC"). At about 12.5 seconds, a large jump in the measured substrate hole current is observed, which signals the onset of a soft breakdown ("SBD"). The total current remains substantially constant at this new level, albeit with some fluctuation in the substrate current, from about 12.5 seconds to about 19 seconds. At about 19 seconds, large jumps in both the electron current and the substrate hole current signal the onset of hard breakdown ("HBD"). FIG. 8 shows that a desired degree of SBD or HBD may be obtained by controlling the time over which the gate oxide storage element is stressed.

Figure 9:
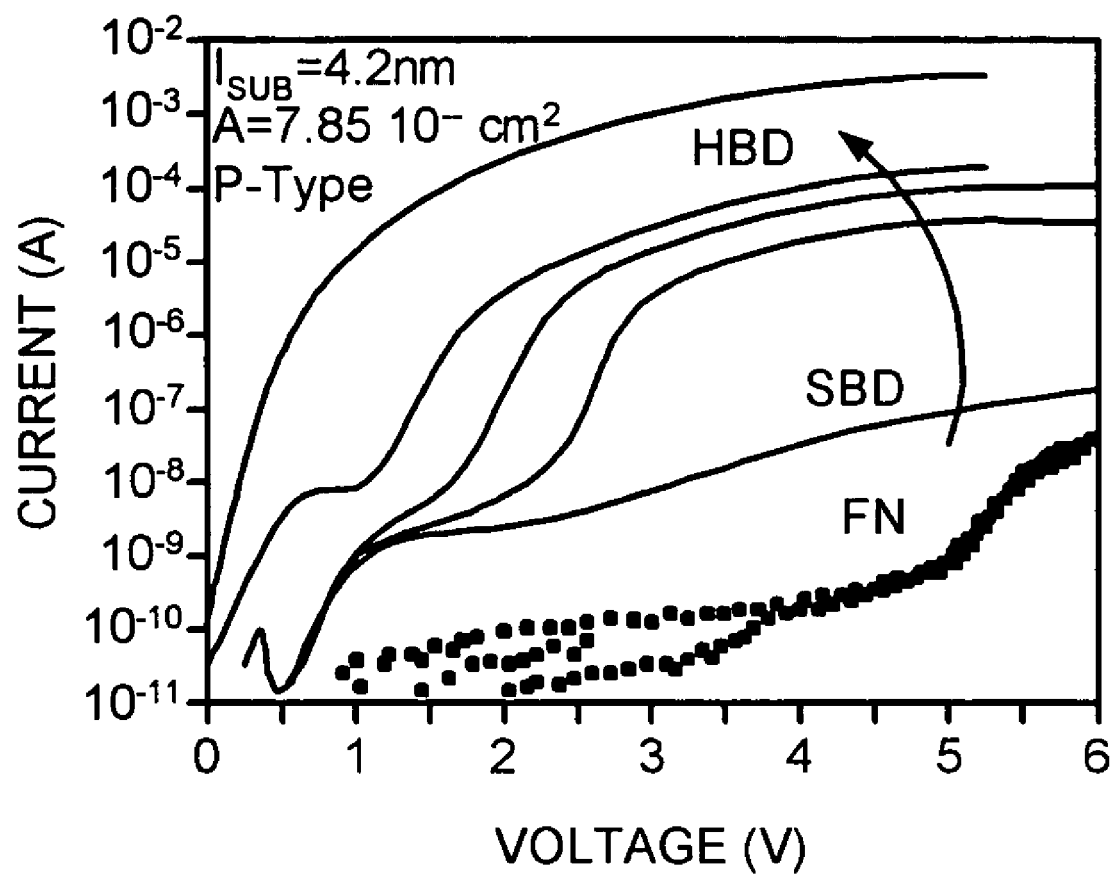
FIG. 9 is a graph showing various stages in the current-voltage characteristics of an ultra-thin gate oxide as degradation proceeds.

Sune et al. studied post SBD conduction in ultra-thin silicon dioxide films. Jordi Sune, Enrique Miranda, Post Soft Breakdown conduction in SiO2 Gate Oxides, IEDM 00-533, 2000. Various stages in the current-voltage ("I-V") characteristics of an ultra-thin gate oxide as degradation proceeds are shown in FIG. 9, in which the x-axis is voltage in volts and the y-axis is current in amperes expressed logarithmically. FIG. 9 shows that a broad range of voltages may be used to program the gate oxide storage element, and that either SBD or HBD may be used to store information in the gate oxide storage element. Several post breakdown I-V characteristics are also included that show the evolution from SBD to HBD. The amount of the leakage current resulting at SBD and HBD as well as at the intermediate situations between these two extremes is roughly linearly dependent on the magnitude of the voltage in a range of about 2.5 volts to 6 volts.

Figure 10:
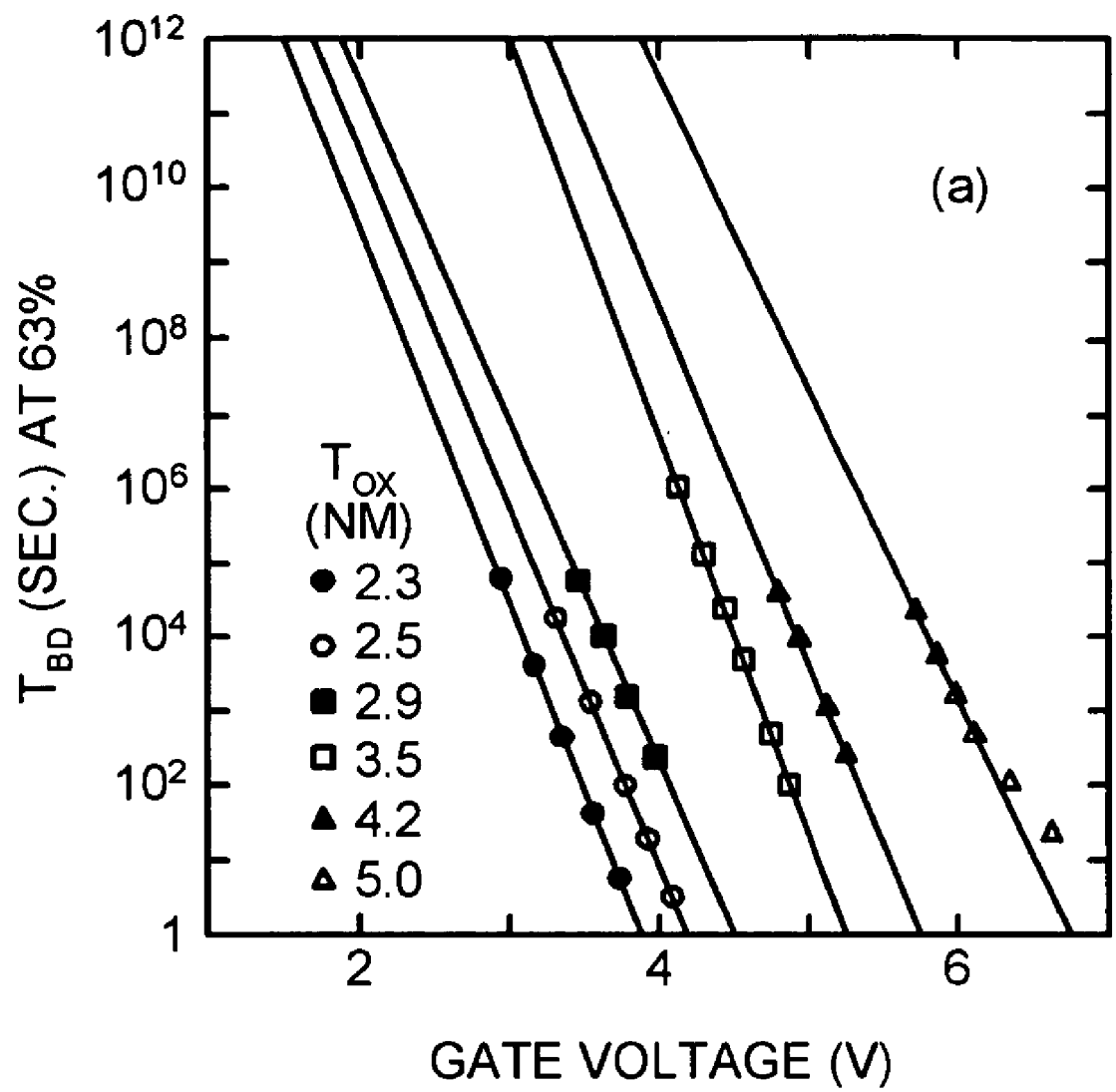
FIG. 10 is a graph showing time-to-breakdown at 63% distribution vs. gate voltage in a semi-log scale measured on n-channel field effect transistors (inversion) for various oxide thickness.

Wu et al. studied the voltage dependency of voltage acceleration for ultra-thin oxides. E. Y. Wu et al., Voltage-Dependent Voltage-Acceleration of Oxide Breakdown for Ultra-Thin Oxides, IEDM 00-541, 2000. FIG. 10 is a graph of time-to-breakdown at 63% distribution vs. gate voltage in a semi-log scale measured n channel FETs (inversion) for oxide thickness varying from 2.3 nm to 5.0 nm. The distributions are in general agreement and are linear, further indicating that the process is controllable.

Figure 11:
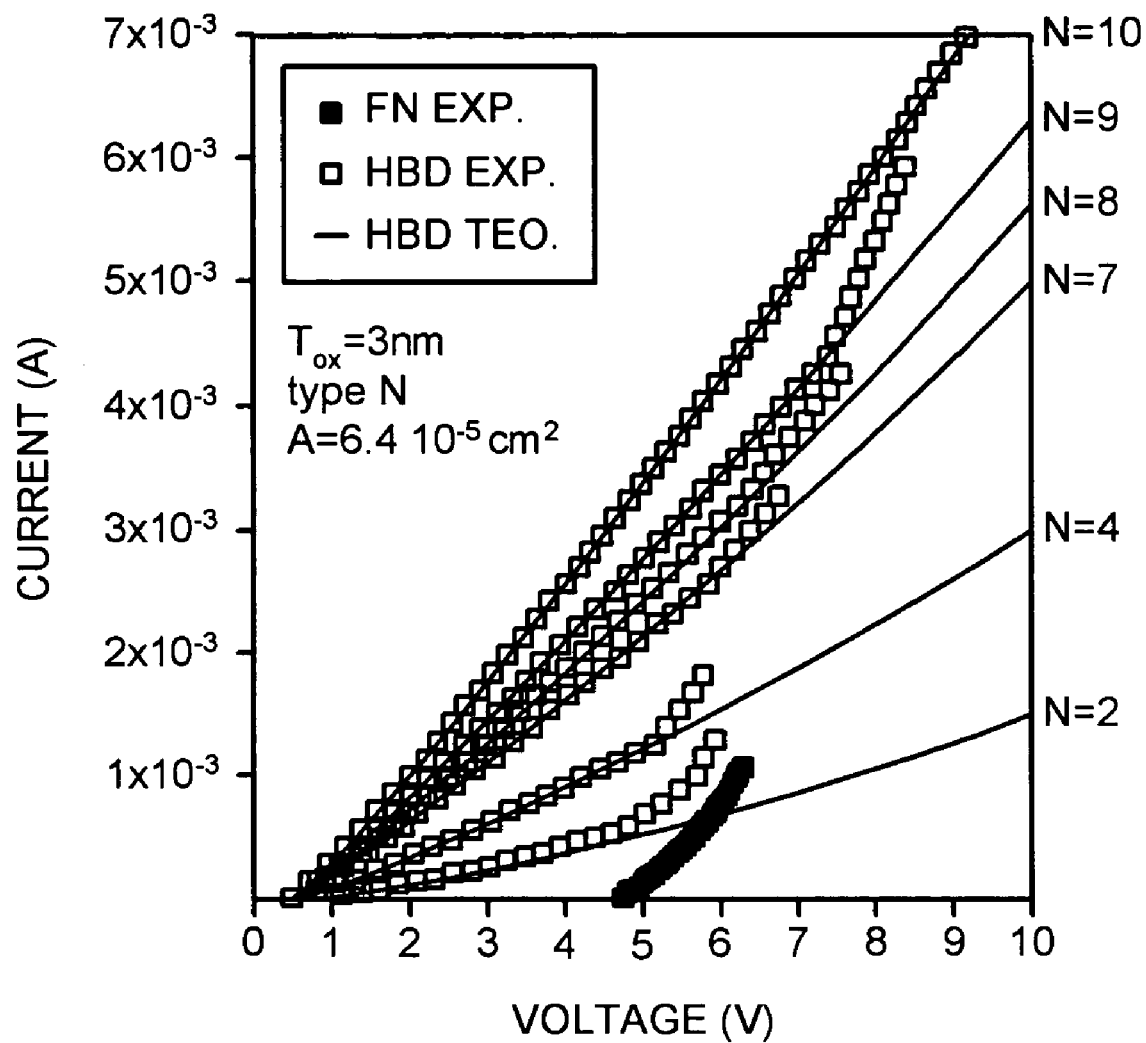
FIG. 11 is a graph showing the current-voltage characteristics of n-type devices measured after the detection of successive breakdown events.

Miranda et al. measured the I-V characteristics of nMOS-FET devices having an oxide thickness of 3 nm and an area of $6.4 \times 10^{-5}$ cm$^2$ after the detection of successive breakdown events. Miranda et al., "Analytic Modeling of Leakage Current Through Multiple Breakdown Paths in SiO$_2$ Films", IEEE 39$^{th}$ Annual International Reliability Physics Symposium, Orlando, Fla., 2001, pp 367–379. FIG. 11 shows the results corresponding to the linear regime in which "N" is the number of conducting channels. The results are quite linear, indicating that the path is essentially resistive.

In the embodiments described above, typically the n-type lightly doped drain (NLDD) implant is blocked to not have the gate overlap with the source/drain N+ diffusions (see FIG. 3 and spacing D). This creates a reverse diode between the wordline N+ S/D diffusion and the bitline polysilicon gate in the programmed cell. This results in reduced leakage between the un-selected wordline (biased at Vdd or even higher, in the case where the floating wordline is charged up by a selected bitline at VPP through a programmed cell) to the unselected bitline (biased at 0 v or floating).

In the structures shown in FIGS. 1–6 and 12–15, the gate-oxide breakdown point is near the gate edge next to the wordline N+ diffusion region (see FIG. 5). The punch-through voltage from the wordline N+ diffusion region to the oxide breakdown point is relatively low, so the reverse diode is not effective to prevent the leakage current from unselected wordlines to unselected bitlines. This may be undesirable for several reasons.

Thus, in accordance with the present invention, the gate oxide that is proximal to the floating N+ diffusion region is made to be more susceptible to breakdown than the gate oxide that is proximal to the wordline N+ diffusion region. While this can be done in a myriad of ways, two separate approaches are described herein: (1) making the gate oxide near the floating N+ diffusion regions thinner than the gate oxide near the wordline N+ diffusion region (various methods for implementing with two specific embodiments shown below); or (2) damaging the gate oxide near the floating N+ diffusion region with an implant so as to make the gate oxide more susceptible to breakdown. It can be appreciated that the present invention is primarily directed to having a lower breakdown voltage at the floating N+ diffusion region and that any manufacturing or structural implementation now possible or developed in the future for achieving that aim is within the scope of this invention.

Figure 16:
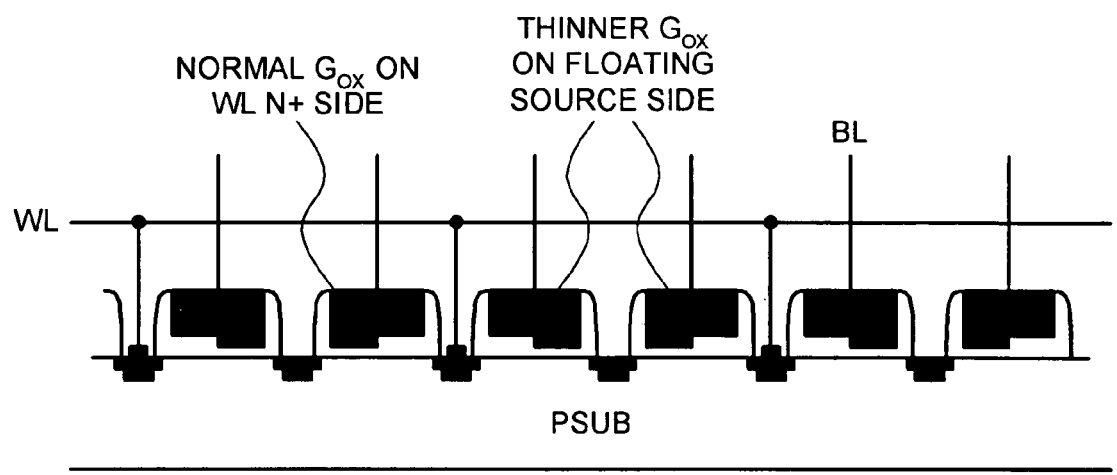
FIG. 16 is a cross section view of one embodiment of memory cells formed in accordance with the present invention.

In one embodiment, as seen in FIG. 16, in order to shift the gate oxide breakpoint away from the gate edge at the wordline N+ diffusion region, the gate oxide may be made thinner at the side of floating N+ source (diffusion) region (Alternative 1). The floating N+ diffusion region connects the adjacent two cells on the same wordline. Alternatively, the gate oxide may be made thicker at the side of the gate near the wordline N+ region (Alternative 2). Note that the present invention can be easily extended to a PMOS device where PMOS devices are formed inside an N-well.

Memory cells using this differential gate oxide MOS device have the following advantages:

1. Cell programming by oxide breakdown always occurs preferentially on the floating source side of the gate.

2. This provides a robust reverse diode between the drain (wordline contact) and the polysilicon gate (bitline) of a programmed cell.

3. The reverse diode punchthrough voltage is thereby greatly improved compared with the uniform gate oxide cell, where the gate oxide breakdown could occur near the drain side (resulting in low punch through voltage of the reverse diode).

4. The programming voltage will be reduced (down to 3.5–5V) since the source side gate oxide thickness is much thinner than the standard gate oxide, which normally requires 6 to 6.5V to program.

Figure 17:
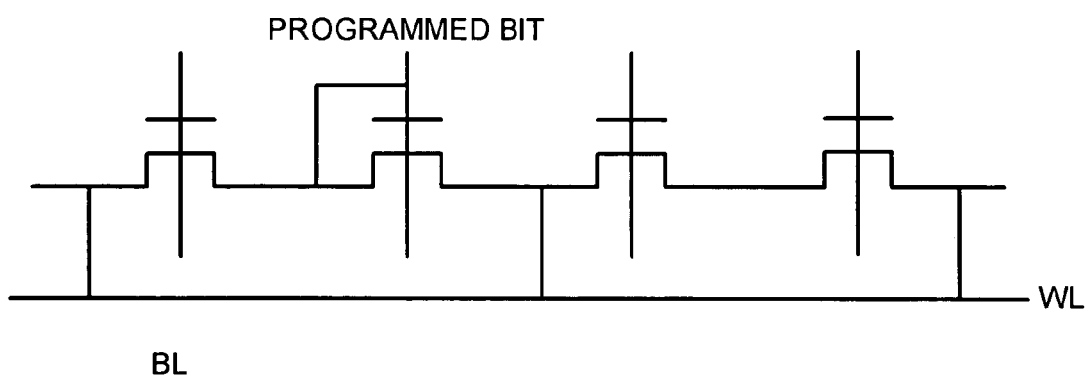
FIG. 17 is a schematic circuit diagram of the memory cells of FIG. 16.

FIG. 17 illustrates the equivalent electrical circuit of the differential-oxide 1T memory cell. FIG. 18 shows the cell operation bias voltages of one embodiment. There are several techniques that can be used to form such differential gate oxide, two of which are described below.

Alternative 1: Using nitrogen (N2) implant (or other implant species which can reduce the silicon oxidation rate) on one side of the gate to create differential gate oxide thickness. However, the differential gate oxide created by this method is not self-aligned.

Figure 19:
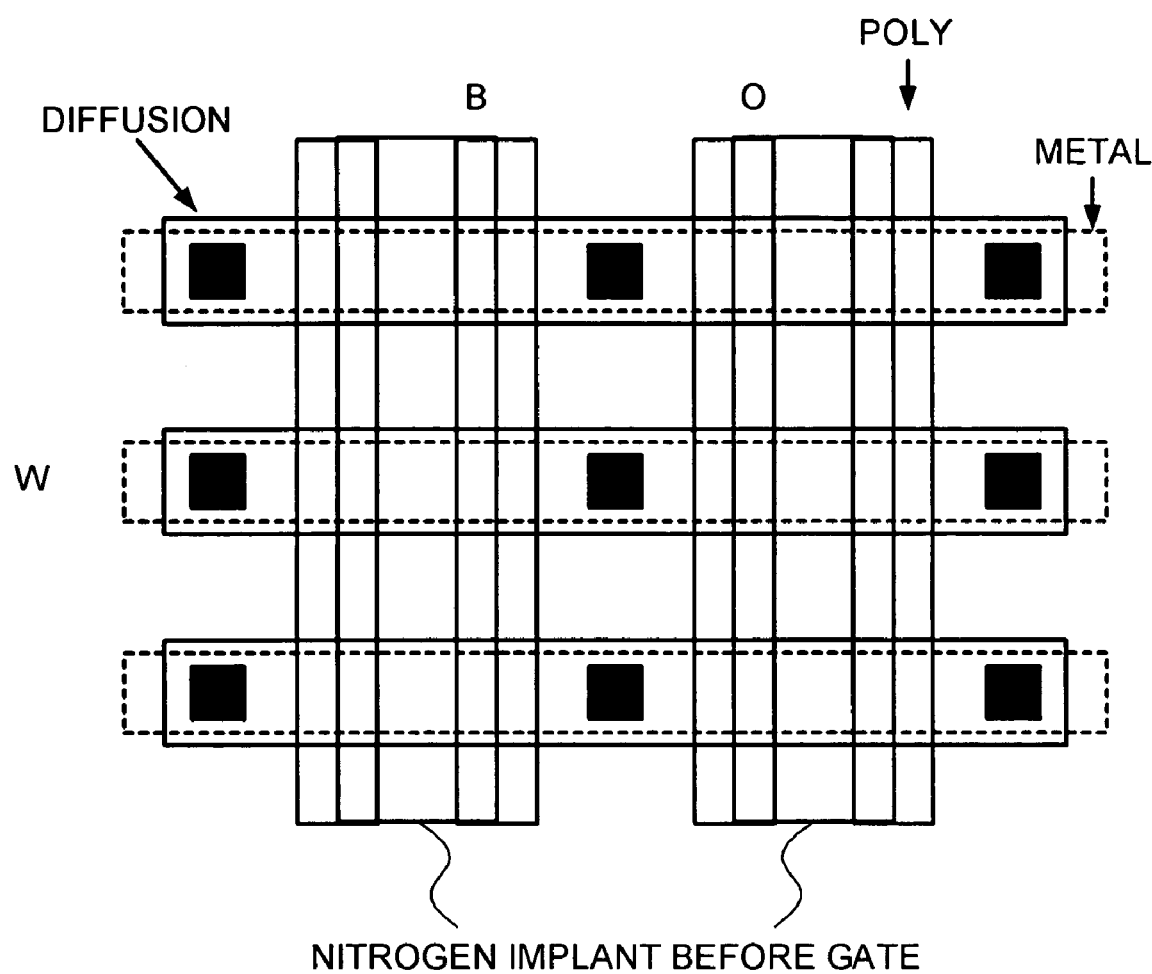
FIG. 19 is a top layout view showing the extent of a nitrogen implant in one method of forming the memory cells of FIG. 16.
Figure 20:
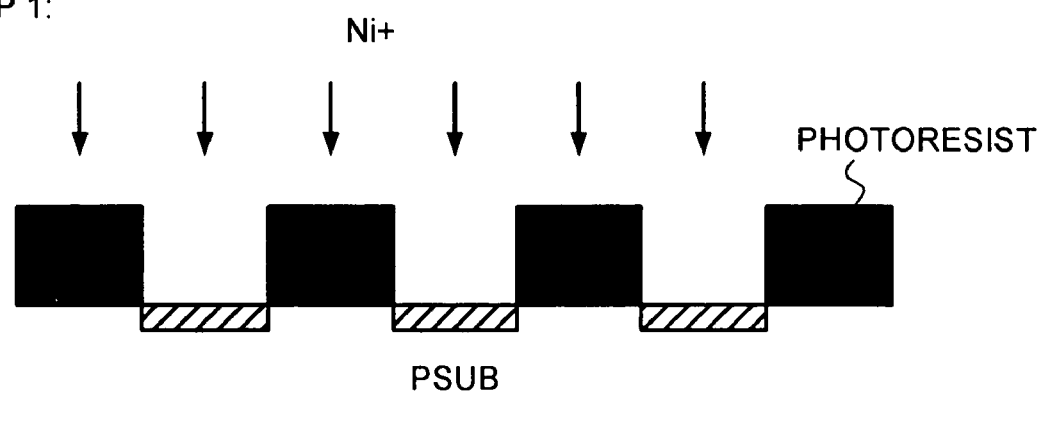
FIGS. 20–23 show cross sectional views of one method for forming the memory cells of FIG. 16.

As seen in FIGS. 19 and 20, after the Pwell and channel Vt implant, a photomask is used to make a selected nitrogen implant in the silicon region where the thinner gate oxide will be grown.

Figure 21:
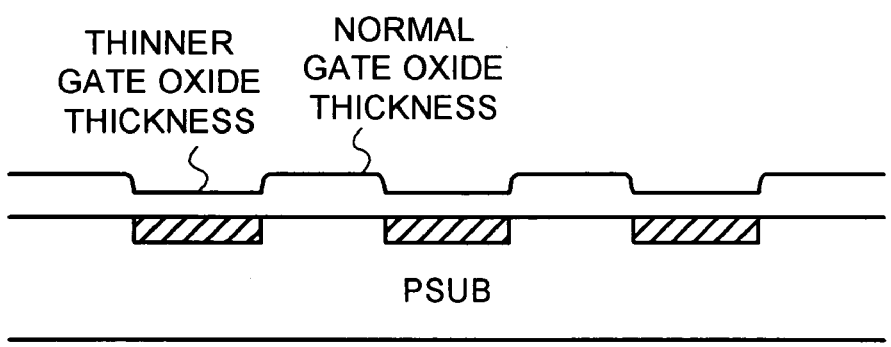

Next, turning to FIG. 21, the post implant photomask is removed, a preliminary gate oxidation cleaning step is performed, and a normal gate oxidation is performed to grow 20 A (for 0.13 um generic process) on the non-nitrogen implanted area. At the same time, a 10 to 15 A thinner gate oxide will be grown in the nitrogen implanted silicon region.

Figure 22:
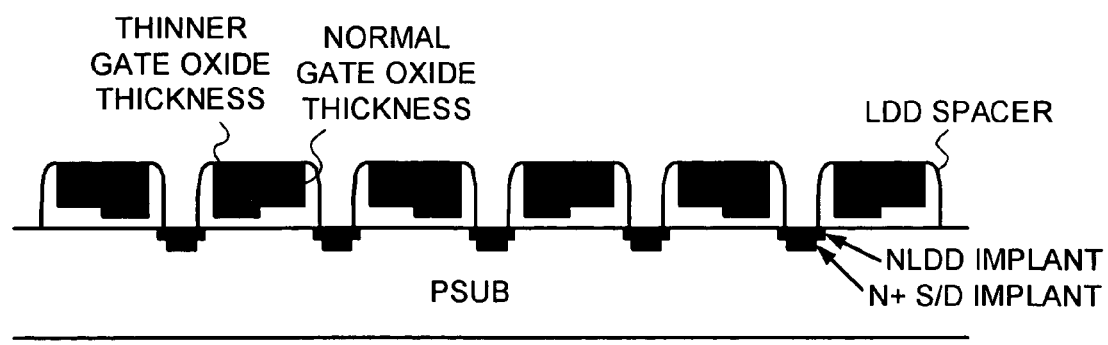

Turning to FIG. 22, after the gate polysilicon deposition and polysilicon gate etch, this is followed by a NLDD implant and N+ S/D implant. Finally, a NMOS memory cell with differential gate oxide thickness on the source and drain are formed as shown.

Figure 23:
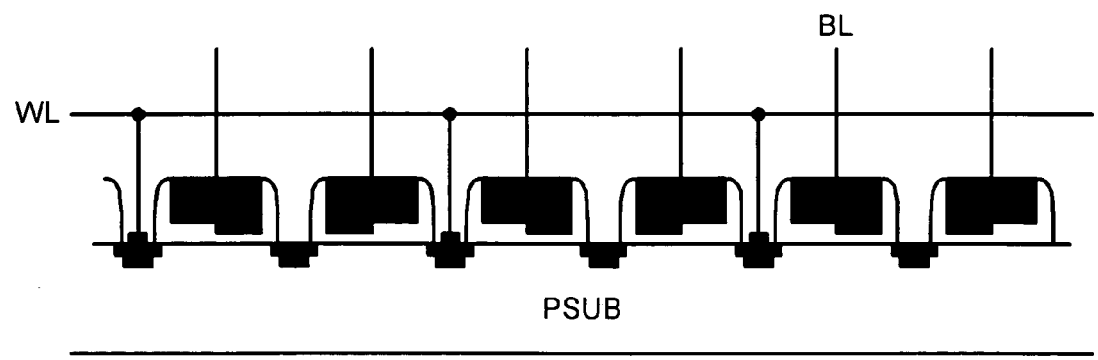

Finally, turning to FIG. 23, after contact connection to the word line diffusions (wordline) and polysilicon bit lines (bitline), the memory cell with differential gate oxide NMOS devices are formed.

Figure 24:
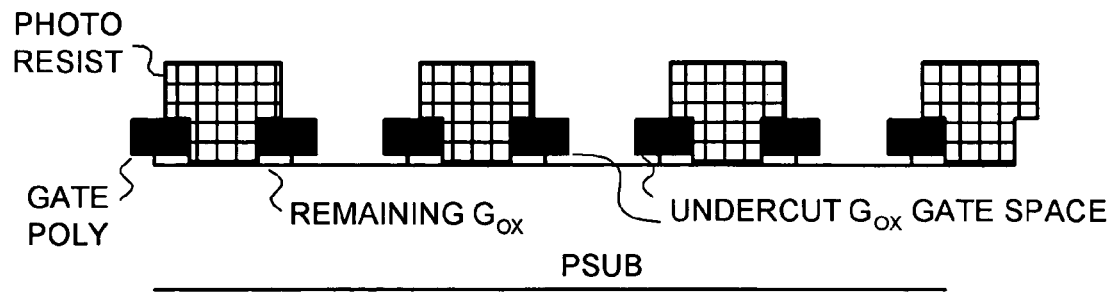
FIGS. 24–25 show cross sectional views of an alternative method for forming the memory cells of FIG. 16.

In an alternative method (Alternative 2), an isotropic etch is used on the drain side followed by oxidation. The differential gate oxide created by this method is self-aligned. Specifically, as seen in FIG. 24, after the gate polysilicon etch, a photoresist is used to cover the source side, and an isotropic etch (usually wet etch) is performed to create an undercut on the drain (wordline) side gate oxide.

Figure 25:
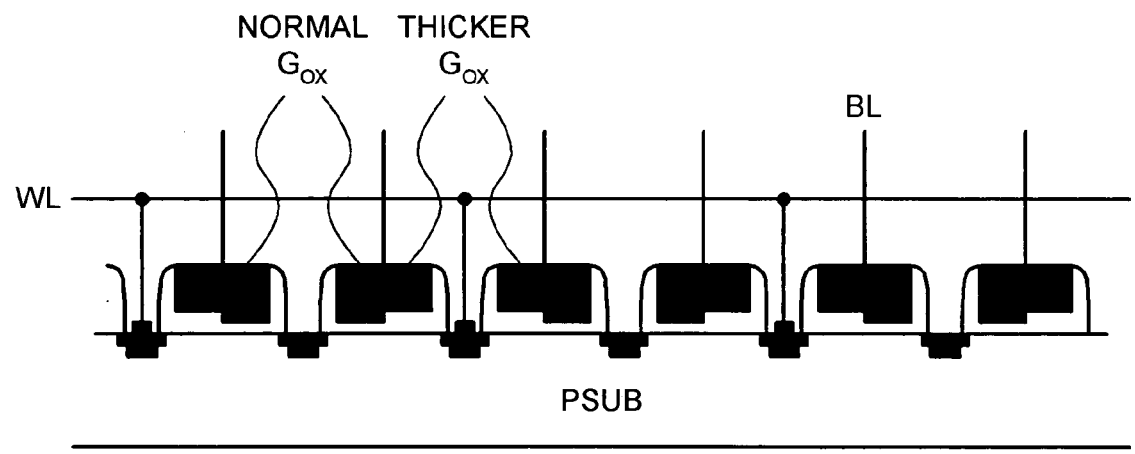

Next, as seen in FIG. 25, the photoresist is removed and an oxidation step is performed to fill in the undercut gate, thus making a thicker gate oxide on the drain (wordline) side. This is followed by regular NLDD implant, spacer deposition, spacer etch and S/D) implant.

The above two methods describe making the thickness of the gate oxide different based upon location relative to the source and drain of the transistor. This is done in order to have a lower breakdown voltage for the gate oxide nearer the floating N+ diffusion region. Another method for accomplishing the same task is to damage the gate oxide nearer the floating N+ diffusion region by, for example, implantation of heavy ions.

Figure 26:
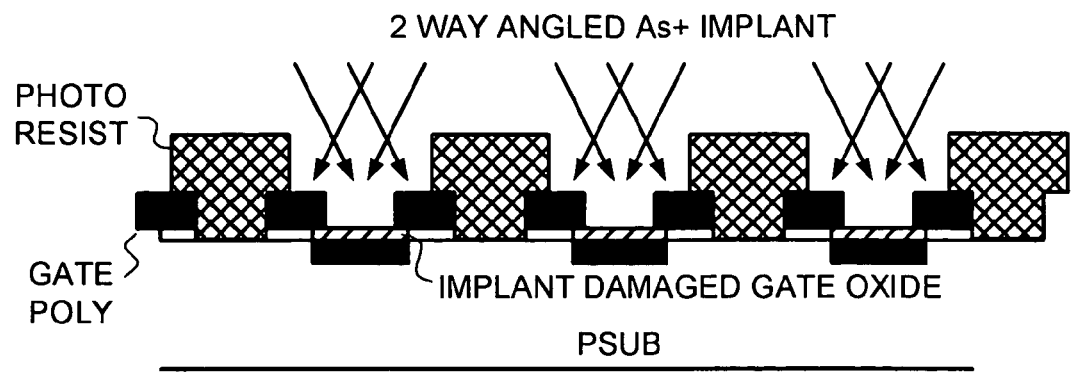
FIGS. 26–27 show cross sectional views of an alternative method for forming memory cells of the present invention.
Figure 27:
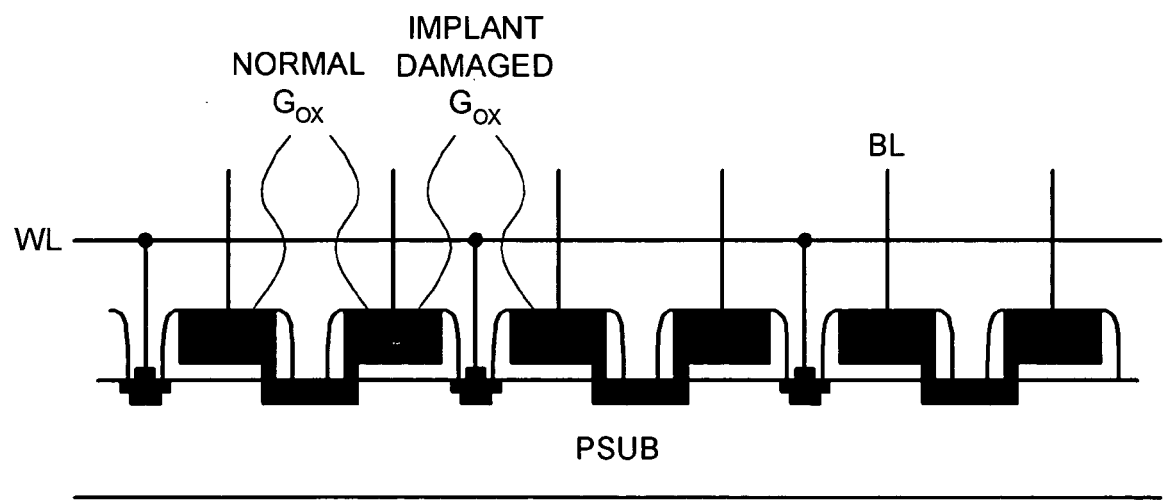

Specifically, another method is to implant heavy ions, such as As+, to selectively damage the gate oxide to make its oxide breakdown voltage lower than the normal gate oxide. This is also a self-aligned process. For example, as seen in FIG. 26, after the gate polysilicon etch, a photoresist is used to cover the drain side. Then, an angled (15~60 degrees, and 2 way or 4 way rotation implants) As+ implant is performed on the floating source side. As seen in FIG. 27, the next step is to remove the photoresist and perform the regular LDD implant, spacer deposition, spacer etch and S/D implant.

To summarize the above embodiments, the buried N+ layer embodiment of FIGS. 12–15 requires a special (and often complex) implant process. The implant is used to create the buried N+ layer connection underneath the surface channel in order to eliminate the contacts to the wordline. The variable gate oxide breakdown embodiments of FIGS. 16–27 require additional and special process steps to make a variable $G_{ox}$.

Figure 28:
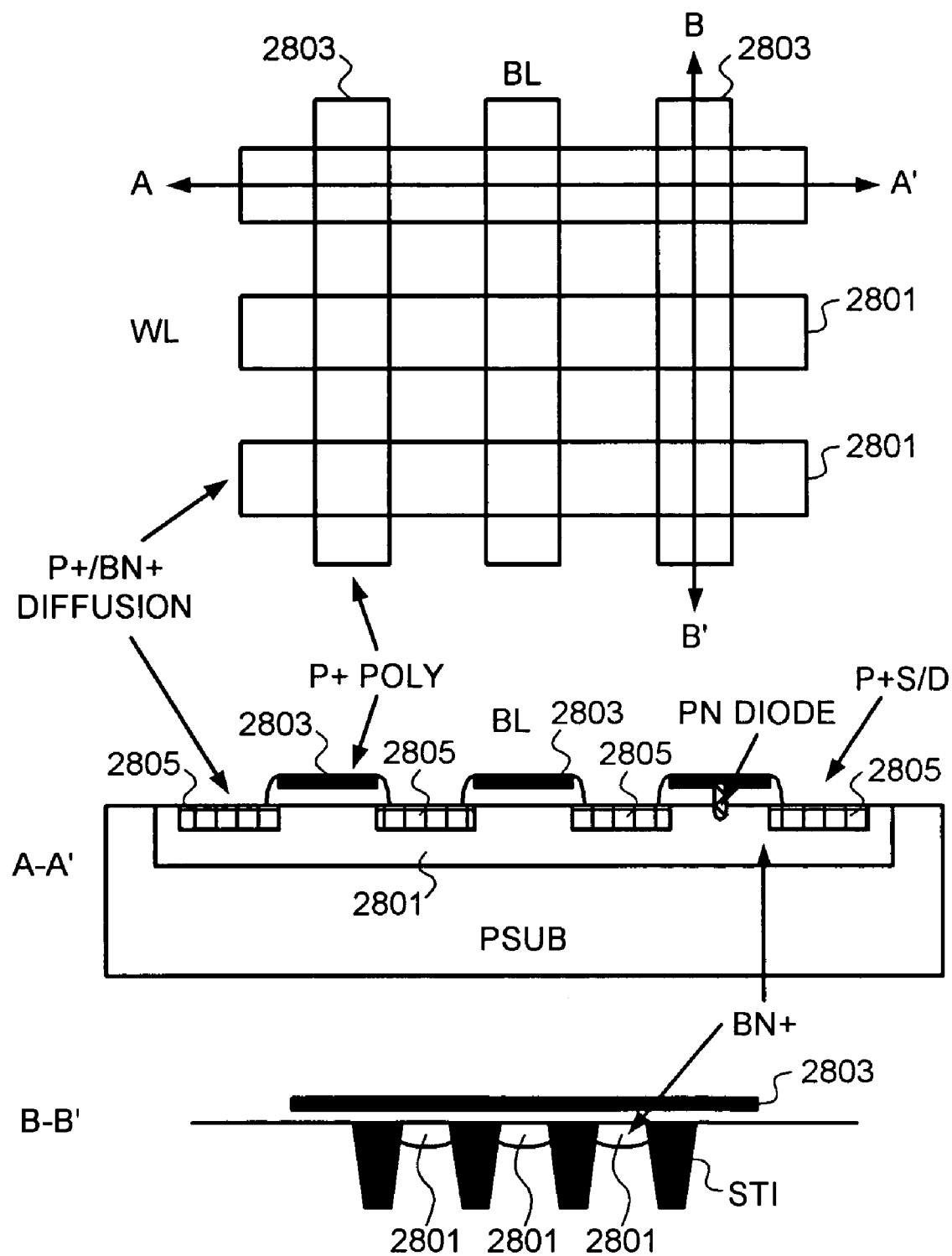
FIG. 28 shows top and cross-sectional views of an alternative embodiment of the present invention.

In yet another alternative embodiment shown in FIG. 28, a surface N+ diffusion is used to replace the deep buried N+ layer. Note that the term diffusion as used herein is meant to encompass doped regions formed by both implanted or diffusion processes. This embodiment can be manufactured using a standard CMOS process flow with one additional mask and implant step. After the oxide breakdown, the PN junction diode can then be formed.

As seen in FIG. 28, the transistors are now similar to PMOS transistors in the sense that a surface N+ wordline replaces the traditional N-well. Note however that the N+ wordline 2801 is isolated by shallow trench isolations. The surface level N+ wordline 2801 is formed (by either diffusion or implant) at the surface of the substrate. For example, an As+ (or any other n-type dopant) diffusion may be performed prior to gate oxidation. Alternatively, if an implant is used, the As+ may be implanted before or after the gate oxidization, or even after the polysilicon gate deposition, to form the N+ wordlines 2801.

After the N+ wordline 2801 is formed in the substrate, and the gate oxidation process is complete, the polysilicon layer is formed over the gate oxide. The polysilicon layer is then conventionally etched to form the bitlines 2803. Then, collateral (i.e. unnecessary) P+ S/D regions 2805 are also formed, such as for example, by using a self-aligned implant step. As part of this implantation, the polysilicon layer that forms the gate of the transistors is implanted and becomes P+ type polysilicon. This implementation is compatible with standard CMOS logic process and saves additional masking and implantation steps. However, this implementation will also result in unneeded collateral P+ source/drain doping.

It should be noted that the N+ wordline 2801 should be deeper than the P+ S/D region 2805 to ensure a good conductance to the N+ wordline 2801. However, the N+ wordline should not be too deep in order to prevent low punch-through leakage between the adjacent bitlines through the shallow trench isolation (STI).

Figure 28A:
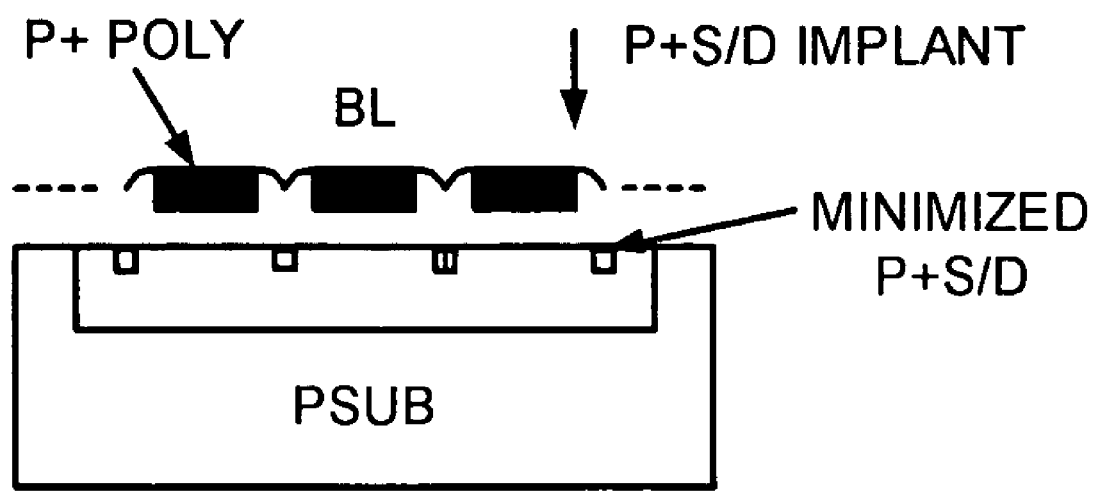
FIG. 28A is an alternative embodiment of FIG. 28 where the spacing of the polysilicon bitlines is minimized.
Figure 33:
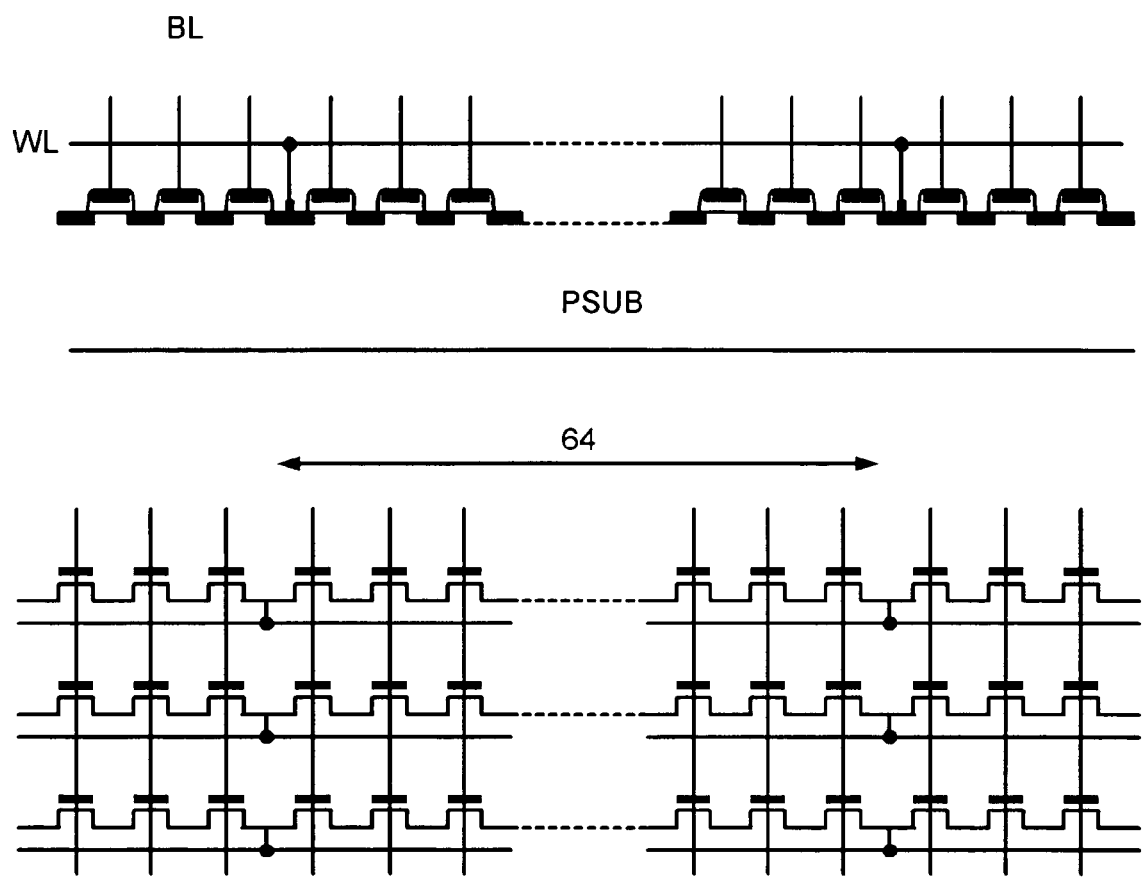
FIG. 33 is a schematic diagram of a memory array of FIG. 28.

In order to minimize the effect of the collateral P+ source/drain doping blocking the buried N+ connection, the spacing between adjacent polysilicon lines can be made as small as possible. By doing this, the lightly doped drain (LDD) spacer will approach each other to effectively minimize or even eliminate the P+ source/drain implant. An example of this can be seen in FIG. 28A. Moreover, as seen in FIG. 33, the N+ wordline is contacted to the memory array periodically, such as every 64 columns.

The operation of the memory array is shown in the table of FIG. 29. The programming voltage (VPP) is the voltage necessary between the bitline and the wordline sufficient to punchthrough or electrically breakdown the gate oxide.

Because the programming voltage is the difference between the voltage on the wordline (Vwp) and the bitline (Vbp), various combinations of voltages can be distributed between the bitlines and wordlines.

In one embodiment, VPP=|Vwp−Vbp|=7~10V for Gox=32 Å (0.18 um process) or 5~7V for 20 Å (0.13 um process). In one embodiment, Vwp=0~VPP and Vwp can be conveniently set as Vdd. Vbp can be in the range of −VPP~+VPP. Vrd is the read voltage, which is between Vcc to Vdd. Vcc=1.8V for 0.18 um process and 1.2V for 0.13 um process. Vdd is the I/O voltage (3.3V or 2.5V).

Figure 30:
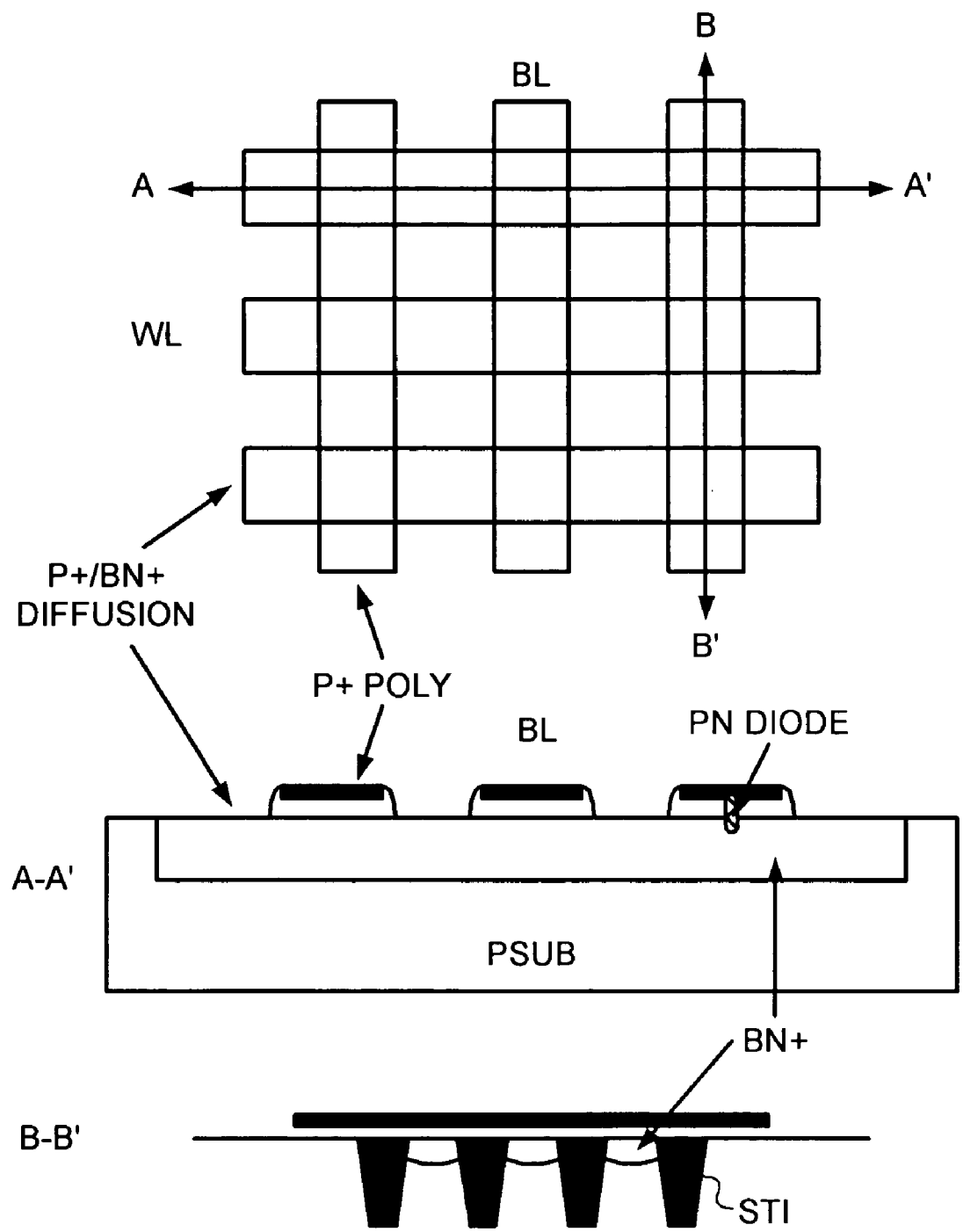
FIG. 30 shows top and cross-sectional views of another alternative embodiment of the present invention.

An alternative embodiment is shown in FIG. 30. In this embodiment, source and drain regions are not formed. This embodiment would likely be implemented where a CMOS process that has selective doping (such as during deposition, or implant dopings after polysilicon deposition and doping) for P+ polysilicon or N+ polysilicon prior to the polysilicon etch. In that case, the concern of the P+ S/D doping blocking the N+ wordline is no longer an issue. That will result in the device structure as shown in FIG. 30. Thus, in this embodiment, the structure is simply intersecting polysilicon bitlines over the top of buried wordlines. The principles of operation are substantially the same as shown in FIG. 29.

Figure 31:
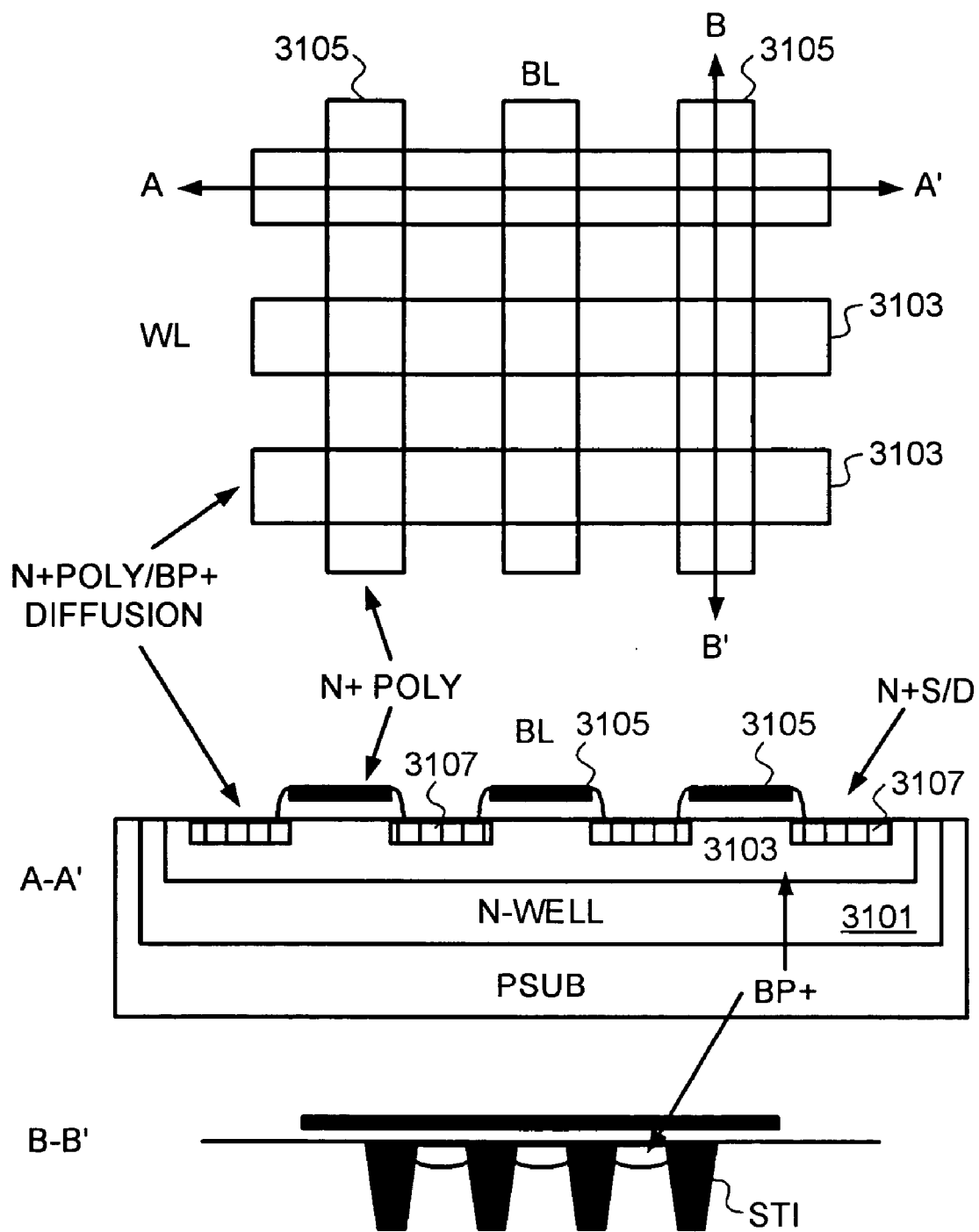
FIG. 31 shows top and cross-sectional views of another alternative embodiment of the present invention with N-type polysilicon doping.

The concepts above can be easily extended to a N+ poly/gate oxide/P+ wordline embodiment. In such an embodiment, the doping types are simply reversed, with the array formed in an N-well. Specifically, as seen in FIG. 31, an N-well 3101 is first formed in the substrate. Then, a p-type dopant such as boron is introduced into the N-well to form the P+ wordlines 3103. The p-type doping can be performed either before or after the gate oxidization, or even after the polysilicon deposition.

After the P+ wordline 3103 is formed in the substrate, and the gate oxidation process is complete, the polysilicon layer is formed over the gate oxide. The polysilicon layer is then conventionally etched to form the bitlines 3105. Then, N+ S/D regions 3107 are formed, such as for example, by using a self-aligned implant step. As part of this implantation, the polysilicon layer that forms the gate of the transistors is also implanted and becomes N+ type polysilicon.

It should be noted that the P+ wordline 3103 should be deeper than the N+ S/D region 3107 to ensure a good conductance to the P+ wordline 3103. However, the P+ wordline should not be too deep in order to prevent low punch-through leakage between the adjacent bitlines through the shallow trench isolation (STI).

Further, in this embodiment, source and drain regions need not be formed. This embodiment would likely be implemented where a CMOS process that has selective doping (such as during polysilicon deposition, or implant doping after the polysilicon deposition) for N+ polysilicon prior to the polysilicon etch. In that case, the concern of the N+ S/D doping blocking the P+ wordline is no longer an issue.

The cell array operation is shown in the table of FIG. 32. The programming voltage VPP can be split between the bitlines and wordlines. VPP=|Vbp−Vwp|=7~10V for Gox=32 Å (0.18 um) or 5~7V for 20 Å (0.13 um). Vbp can be in the range of −VPP~+VPP, and Vwp can be in the range of 0V~VPP, or conveniently set to Vdd. Vrd is the read voltage, which is between Vcc to Vdd. Vdd is the I/O voltage of 3.3V or 2.5V. Vcc=1.8V for 0.18 um and 1.2V for 0.13 um process.

The embodiments shown in FIGS. 28–32 provide advantageous characteristics. For example:

(1) A gate oxide anti-fuse memory cell array consisting of cells with size 4F^2 (where F is the minimum feature size) can be constructed using standard CMOS process with only one additional buried N+ or P+ mask and implants.

(2) The cells are constructed by structures of P+poly/Gox/ N+ wordline/P-well or N+poly/Gox/P+ wordline/N-well/P-substrate. The buried diffusion wordlines can be isolated by standard STI or by other isolation methods.

(3) The bitlines and wordlines are constructed by counterdoped polysilicon lines and buried diffusion lines.

(4) The cell array can be selectively programmed by applying the VPP across the cell gate oxide in both polarities. After the programming Gox breakdown, a P-N junction diode is formed between the polysilicon and the buried diffusion lines.

(5) The programmed cell can be selectively read out by apply positive voltage to the P terminal of the PN junction diode so as to forward bias the diode to form a sense current.

(6) The programming voltage VPP can be distributed between the bitlines and wordlines, so the programming voltage on either bitlines or wordlines can be reduced.

Note that the transistors used in the memory cells described herein in most cases are normal low voltage logic transistors having, for example, an ultra-thin gate oxide thickness on the order of 50 Å for a 0.25 μm process, or on the order of 20 Å for a 0.13 μm process. The voltage across such an ultra-thin gate oxide can be temporarily during programming much higher than $V_{CC}$, which typically is 2.5 volts for an integrated circuit fabricated with a 0.25 μm process, and 1.2 volts for an integrated circuit fabricated with a 0.13 μm process. Such ultra-thin oxides typically can stand up to as much as 4 or 5 volts without significant degradation on the transistor performance.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. Further, the various doping types may be reversed, such that an n-channel transistor described above may be replaced with a p-channel transistor. In such a situation, the p-channel transistor would be formed in a large n-well and a buried p+ layer may be used. These and other variations and modifications of the embodiments disclosed herein may be made without departing from the scope and spirit of the invention.

What is claimed is:

1. A non-volatile programmable memory cell formed in a p-type semiconductor substrate and useful in a memory array having column bitlines and row wordlines, the memory cell comprising:

a transistor having a p+ doped gate, a gate dielectric between the gate and over said substrate, and first and second doped semiconductor regions formed in said substrate adjacent said gate and in a spaced apart relationship to define a channel region therebetween and under said gate, the gate being formed from one of said column bitlines; and wherein the second p+ doped semiconductor region of the transistor is connected to one of said row wordlines, and wherein said row wordline is formed by an n-type region near the surface of said semiconductor substrate.

2. The memory cell of claim 1 wherein said gate is formed from one of said column bitlines.

3. The memory cell of claim 1 wherein said memory cells further including a non-volatilely programmed doped region formed in said substrate in a channel region when said memory cell has been programmed.

4. A non-volatile programmable memory cell formed in an n-type well and useful in a memory array having column bitlines and row wordlines, the memory cell comprising:
   a transistor having a n+ doped gate, a gate dielectric between the gate and over a substrate, and first and second doped semiconductor regions formed in said substrate adjacent said gate and in a spaced apart relationship to define a channel region therebetween and under said gate, the gate being formed from one of said column bitlines; and
   wherein the second n+ doped semiconductor region of the transistor is connected to one of said row wordlines, and wherein said row wordline is formed by a p-type region near the surface of said n-type well.

5. The memory cell of claim 4 wherein said gate is formed from one of said column bitlines.

6. The memory cell of claim 4 wherein said memory cells further including a non-volatilely programmed doped region formed in said substrate in a channel region when said memory cell has been programmed.

7. The memory cell of claim 4 wherein said n-type well is replaced by an n-type substrate.

* * * * *